US007321525B2

(12) United States Patent
Matsui

(10) Patent No.: US 7,321,525 B2
(45) Date of Patent: Jan. 22, 2008

(54) SEMICONDUCTOR INTEGRATED CIRCUIT DEVICE

(75) Inventor: Shigezumi Matsui, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/505,328

(22) Filed: Aug. 17, 2006

(65) Prior Publication Data

US 2007/0058479 A1 Mar. 15, 2007

(30) Foreign Application Priority Data

Sep. 13, 2005 (JP) ............................. 2005-265819
Jun. 20, 2006 (JP) ............................. 2006-169485

(51) Int. Cl.
*G11C 7/00* (2006.01)
(52) U.S. Cl. ...................................... 365/233; 365/194
(58) Field of Classification Search ................ 365/233, 365/194
See application file for complete search history.

(56) References Cited

U.S. PATENT DOCUMENTS 6,757,347 B1 * 6/2004 Lo et al. ..................... 375/355
7,126,399 B1 * 10/2006 Lee ............................ 327/261
2005/0047192 A1    3/2005 Matsui et al.
2007/0025175 A1 *  2/2007 Liu et al. .................... 365/233

FOREIGN PATENT DOCUMENTS

JP        2005-078547        9/2003

* cited by examiner

*Primary Examiner*—Michael T Tran
(74) *Attorney, Agent, or Firm*—Reed Smith LLP; Stanley P. Fisher, Esq.; Juan Carlos A. Marquez, Esq.

(57) ABSTRACT

The present invention provides a semiconductor integrated circuit device provided with an interface circuit, which has realized speeding-up. A first input circuit inputs a data strobe signal therein, and a second input circuit inputs therein data formed in sync with the timing of a change in the data strobe signal. A second delay time determination circuit determines an arriving delay time relative to an internal clock in a predetermined determination region in response to the data strobe signal inputted through the first input circuit. The data sampled using the data strobe signal and inputted through the second input circuit is synchronized with the internal clock. A first delay time determination circuit is provided which determines each signal delay time in accordance with a test clock sent via a dummy input/output circuit equally set to signal delay times of a first output circuit and the first and second input circuits. The determination region is changed in time on the basis of the result of determination by the first delay time determination circuit.

27 Claims, 20 Drawing Sheets

SEMICONDUCTOR INTEGRATED CIRCUIT DEVICE

CROSS-REFERENCE TO RELATED APPLICATION

The present application claims priority from Japanese patent applications Nos. 2006-169485 filed on Jun. 20, 2006 and 2005-265819 filed on Sep. 13, 2005, the contents of which are hereby incorporated by reference into this application.

BACKGROUND OF THE INVENTION

The present invention relates to a semiconductor integrated circuit device such as a microcontroller having a memory interface controller to which, for example, a mobile DDR-SDRAM (Double Data Rate-Synchronous Dynamic Random Access Memory) is connected, and particularly to a technique effective if applied to a synchronization circuit which synchronizes read data with an internal clock.

The inventors or the like of the present application have proposed a technology wherein in a semiconductor integrated circuit such as a data processor having a memory interface controller connected with a DDR-SDRAM as described in a patent document (Japanese Unexamined Patent Publication No. 2005-78547), read data is synchronized with an internal clock on the memory interface controller side. This synchronization technique intends to determine an arriving delay of a data strobe signal relative to an internal clock, using the data strobe signal inputted in a read cycle with respect to the DDR-SDRAM as shown in FIG. 1 of the patent document 1, sample read data, based on a signal obtained by shifting the phase of the data strobe signal carried from a memory and synchronize the sampled read data with the internal clock, based on the result of determination of the arriving delay. As shown in FIG. 11 of the patent document 1, a pulse control circuit measures each signal delay at an input/output buffer and synchronizes signals DQ and DQS using it.

In the DDR-SDRAM, a clock synchronization circuit like a DLL (or PLL) is built therein, and an external clock and an internal clock are synchronized with each other. There has however been proposed a so-called mobile-spec DDR-SDRAM in which in order to attain mobile small electronic equipment typified by a cellular phone, the clock synchronization circuit like the DLL or PLL is eliminated to attain low power consumption. The inventors of the present application have discussed that a memory interface of the patent document 1 is mounted on such a microcontroller (hereinafter called simply "MCU") as shown in FIG. 16 and the mobile DDR-SDRAM (hereinafter called simply "MB-DDR SDRAM") is connected thereto. According to the discussions, it was revealed that the following problems arose.

In FIG. 16, a delay time td1 occurs in clocks/CK and CK with respect to the internal clock on the output side of MCU. Since the clock synchronization circuit is not mounted to MB-DDR SDRAM, a delay time td2 is generated between the input of the clocks/CK and CK and the output of signals DQ and DQS. On the input side of MCU, a delay time td3 occurs in DQin and DQSin with respect to the signals DQ and DQS. In the case of MCU, as shown in FIG. 17(A), a fluctuation width exists in delay times td1+td3 of a worst case and a best case having considered a process variation, a variation in source voltage and a change in temperature or the like. Even in the case of MB-DDR SDRAM, as shown in FIG. 17(B), a fluctuation width exists in delay times td2 of a worst case and a best case having considered a process variation, a variation in source voltage and a change in temperature or the like. As viewed from the internal clock of MCU, a large fluctuation width occurs in delay times td1+td2+td3 of a best case and a word case, obtained by adding the above (A) and (B) as shown in FIG. 17(C).

As shown in FIG. 18(A), it can be determined that when the delay times td1 through td3 are small, points at which DQSin changes from a low to high levels depending upon timing determination points t1 through t5 synchronized with an internal clock ckb exist between the determination points t1 and t2, and points at which DQSin changes from a high to low levels exist between the determination points t3 and t4. When, however, the delay times td1 through td3 become larger as shown in FIG. 18(B), a signal indefinite period of DQSin is contained in a determination region for the timing determination points t1 through t5.

This reason is as follows: In a mode for writing from MCU to MB-DDR SDRAM, MCU generates DQS and supplies it to MB-DDR SDRAM together with write data. In a mode for reading from MCU to MB-DDR SDRAM, MB-DDR SDRAM generates DQS and supplies it to MCU together with read data. Thus, since the DQS signal is bidirectionally transferred between MCU and MB-DDR SDRAM, it is placed in a floating (high impedance HiZ) state before the start of memory access.

In the read mode, the read mode is transferred from MCU to MB-DDR SDRAM. As a result, since DQS is rendered low in level by MB-DDR SDRAM, DQS is held in the floating state over a long period of time in response to an increase in each of the time delays td1 through td3. Therefore, the first determination point t1 is brought to a signal indefinite region due to the floating state in MCU. When, for example, an input circuit fetches DQSin with an indefinite level as a high level, a determination circuits makes an erroneous judgment that DQSin has already been changed to the high level at the determination point t1. Therefore, when an attempt is made to delay the determination point t1, the rise point of DQSin at the time that the delay times td1 through td3 are small as shown in FIG. 18(A), cannot be determined. Eventually, in the technology disclosed in the patent document 1, there is a limit to the speeding-up of the clock because the minimum cycle of the internal clock is determined with respect to the fluctuation width of each of the delay times td1 through td3.

SUMMARY OF THE INVENTION

An object of the present invention is to provide a semiconductor integrated circuit device equipped with an interface circuit, which has realized speeding-up. The above, other objects and novel features of the present invention will become apparent from the description of the present specification and the accompanying drawings.

A summary of a typical or representative one of the inventions disclosed in the present application will be briefly explained as follows. A first output circuit supplies an external clock to an external device. A first input circuit inputs a data strobe signal formed corresponding to the external clock at the external device. A second input circuit inputs data formed in sync with the timing of a change in the data strobe signal. A second delay time determination circuit determines an arriving delay time relative to an internal clock in a predetermined determination region in response to the data strobe signal inputted via the first input circuit. Data sampled using the data strobe signal and inputted through the second input circuit is synchronized with the internal clock, based on the result of its determination. A dummy input/output circuit in which signal delay times corresponding to any of the first output circuit and the first and second input circuits are respectively set equally, a pulse control circuit which supplies a test clock to the dummy input/output circuit, and a first delay time determination circuit which determines a signal delay time in response to the test clock sent through the dummy input/output circuit, are provided. The determination region of the second delay time determination circuit is changed in time based on the result of determination by the first delay time determination circuit.

A summary of another representative one of the inventions disclosed in the present application will be briefly explained as follows: A semiconductor integrated circuit device is equipped with an interface circuit, a data processor, and a clock generator. The clock generator generates an internal clock and an external clock. As the interface circuit, the following circuits are provided. A first output circuit supplies the external clock to an external device through a first external terminal. A second output circuit supplies a control signal formed by the data processor to the external device through a second external terminal. A third output circuit supplies a first data strobe signal corresponding to the external clock to the external device through a third external terminal. A fourth output circuit supplies data synchronized with the timing of a change in the first data strobe signal to the external device through a fourth external terminal. A first input circuit inputs a second data strobe signal corresponding to the external clock at the external device through the third external terminal. A second input circuit inputs data synchronized with the timing of a change in the second data strobe signal at the external device through the fourth external terminal. A delay time determination circuit determines an arriving delay time relative to the internal clock in response to the second data strobe signal inputted through the first input circuit. A sampling circuit samples data inputted through the second input circuit in accordance with a timing signal obtained by preferably 90° shifting the phase of the second data strobe signal inputted through the first input circuit. A synchronization circuit synchronizes the sampled data with the internal clock, based on the result of determination by the delay time determination circuit. Each of the third output circuit and the fourth output circuit is a tri-state output circuit which performs an output operation when an output control signal is one level and which is brought to an output high impedance state when the output control signal is the other level. The third output circuit is provided with a circuit which when the circuit is in an output high impedance state by the output control signal, sets the third output external terminal to a fixed level corresponding to a high or low level in accordance with a predetermined signal. During this period, the operation of determination by the delay time determination circuit is performed.

The reason that when the data inputted through the second input circuit is sampled, the timing signal obtained by "90°" shifting the second data strobe signal is used, is that in order to ensure a setup/hold time relative to a data signal at the sampling circuit and to make it possible to ensure the most sufficient time allowance without depending upon the cycle of the data signal, a signal obtained by 90° shifting the second data strobe signal is used as a signal for determining a sampling cycle or period. Therefore, the setup/hold time can be ensured much longer where, for example, the cycle of the data signal is longer. Thus, the amount of shifting of the signal can be suitably changed without liming it to 90°.

Owing to a temporal change in determination region corresponding to each delay time at an input/output circuit, a fluctuation width of each signal delay is less reduced equivalently and speeding-up is enabled. An indefinite level in an output high impedance state results in a fixed level upon delay determination. The synchronization of input data can be carried out without being affected by a variation in delay time at the input/output circuit.

DETAILED DESCRIPTION OF THE PREFFERED EMBODIMENTS

Figure 1:
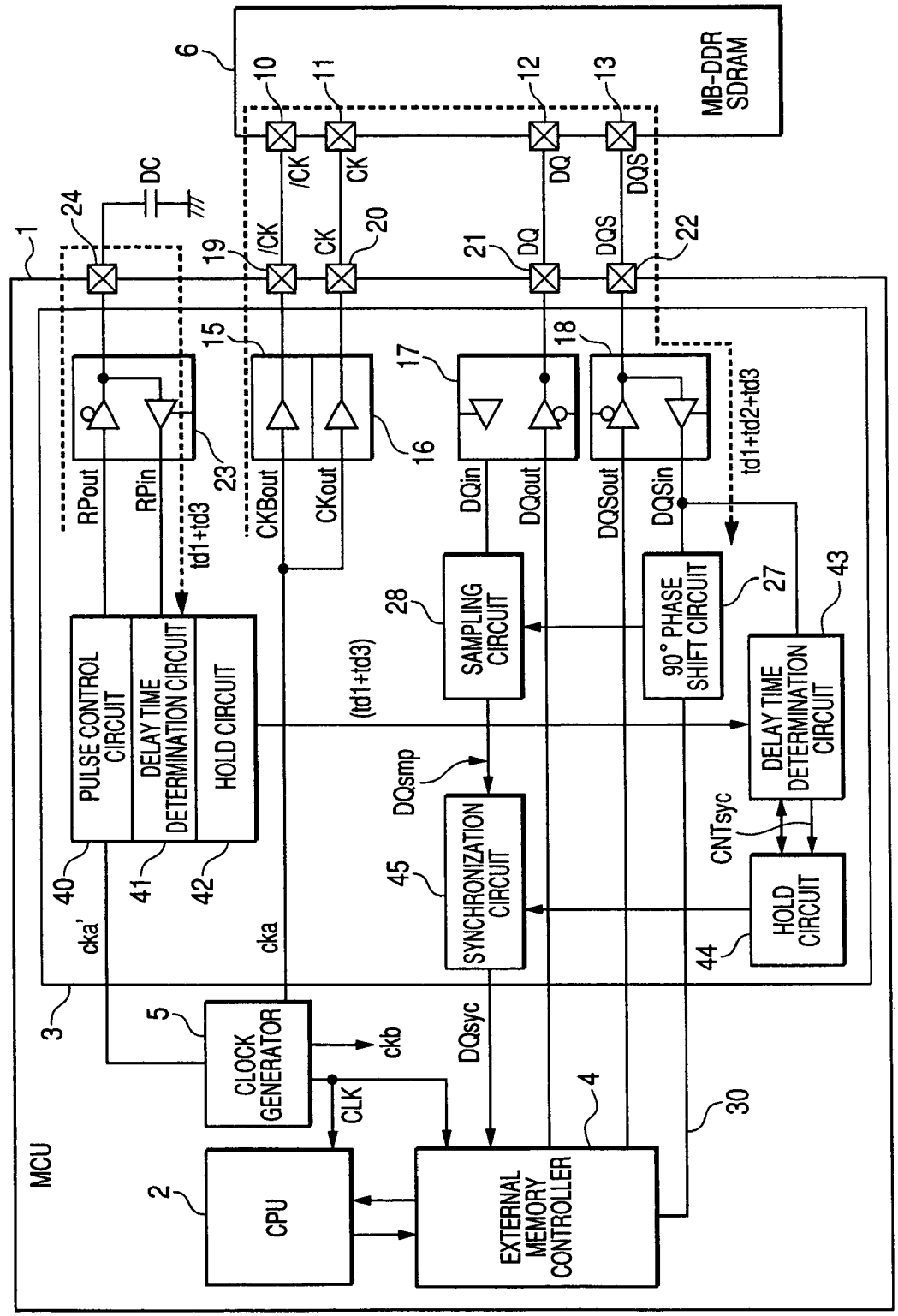
FIG. 1 is a block diagram showing one embodiment of a semiconductor integrated circuit device according to the present invention.

A block diagram of one embodiment of a semiconductor integrated circuit device according to the present invention is shown in FIG. 1. A memory 6 used as an external device accessed thereby is also shown in the same figure together with it. Although not restricted in particular, the semiconductor integrated circuit device 1 shown in the same figure constitutes an MCU (Microcontroller). The semiconductor integrated circuit device 1 is formed on one semiconductor substrate like, for example, monocrystalline silicon by a complementary MOS integrated circuit manufacturing technology or the like.

The MCU 1 has a CPU (Central Processing Unit) 2 used as a typically-illustrated data processor, a memory interface circuit 3, an external memory controller 4 and a clock generator 5. The CPU 2 has an instruction controller and an arithmetic unit. The instruction controller controls an instruction fetch and decodes the fetched instruction. The arithmetic unit performs a data operation and an address operation using operands each designated by the result of decoding of the instruction or an instruction to thereby execute an instruction. The memory interface circuit 3 can be directly connected to the memory 6 constituted of another chip. The memory 6 is configured as, for example, the MB-DDR SDRAM.

The memory interface circuit 3 is connected to the external memory controller 4. The external memory controller 4 performs interface control for obtaining access to the MB-DDR SDRAM 6. Although not restricted in particular, the MB-DDR SDRAM 6 is equivalent to one in which the clock synchronization circuit like DLL or PLL is eliminated from such a known DDR SDRAM as described above. In the MB-DDR SDRAM 6, although not described in detail, various control signals (commands) such as a row address strobe signal (/RAS), a column address strobe signal (/CAS), a write enable signal (/WE), etc. are latched on the rising edge of a clock CK used as memory clock. Input/output data DQ is transferred together with a data strobe signal DQS used as a bidirectional strobe signal. The data strobe signal DQS is defined as a reference clock for a data input/output operation upon a read/write operation.

At the read operation, the MB-DDR SDRAM 6 allows the edge (change point) of the data strobe signal DQS to. coincide with the edge of read data and outputs its result. At the write operation, the external memory controller 4 of the MCU 1 places the edge of the data strobe signal DQS in the center of write data and outputs it to the MB-DDR SDRAM 6. Input terminals 10 and 11 for the clocks CK and /CK, an input/output terminal 12 for the data DQ and an input/output terminal 13 for the data strobe signal DQS are typically shown in FIG. 1 at the MB-DDR SDRAM 6. The clock generator 5 generates internal clocks like clocks cka and ckb corresponding to clocks used for synchronous control of the MB-DDR SDRAM together with an operation reference clock CLK for the CPU 2 and external memory controller 4. For example, a clock b has a frequency equal to twice that of a clock a.

The memory interface circuit 3 has a synchronization circuit for synchronizing the data strobe signal DQS and read data DQ outputted from the MB-DDR SDRAM 6 with the internal clock ckb together with input/output circuits for directly connecting the MB-DDR SDRAM 6 used as the external device thereto.

As the input/output circuits, may be mentioned, for example, typically, output circuits 15 and 16 for the clocks CK and /CK, an input/output circuit 17 for the data DQ, and an input/output circuit 18 for the data strobe signal DQS. The output circuits 15 and 16 respectively output the clocks CK and /CK to the outside through clock output terminals 19 and 20 in accordance with a read operation instruction (READ command) for the MB-DDR SDRAM 6. The input/output circuit 17 is connected to the data terminal 12 of the MB-DDR SDRAM 6 through an external terminal 21. The input/output circuit 18 is connected to the data strobe terminal 13 of the MB-DDR SDRAM 6 through an external terminal 22. As circuits for synchronizing the data strobe signal DQS and the read data DQ with the internal clock, there are provided a delay time determination circuit 43, a hold circuit 44, a phase shift circuit 27, a sampling circuit 28 and a synchronization circuit 45.

The delay time determination circuit 43 measures an achieved or arrival time of the data strobe signal DQS itself to synchronize the signals DQS and DQ outputted from the MB-DDR SDRAM with the internal clock. A delay time (DQSin sereies) from the input/output circuit 18 at the DQS terminal 22 to the delay time determination circuit 43 and the phase shift circuit 27, and a delay time (DQin series) from the input/output circuit 17 at the DQ terminal 21 to the sampling circuit 28 are set in such a manner that they are approximately identical (clock skew (Skew)≈0). The delay time determination circuit 43 measures an achieved or arrival time (delay times td1+td2+td3) of the signal DQSin with the internal clock as the reference. The delay time determination circuit 43 determines at which timing DQS changes from a low level to a high level (a logical 0 to a logical 1), using, for example, both the rising edge and falling edge of the clock ckb which is faster than the clock cka defining an operation cycle of the MB-DDR SDRAM 6 and has a cycle equal to twice that of the clock cka, for example, thereby measuring an arrival time (delay time) of DQSin. In order to avoid recognition of a false edge where the varying edge of DQS is continuous, the measurement for determination of the delay time may preferably be performed when a read bus cycle is not continuous.

The delay time of DQS measured by the delay time determination circuit 43 is set to the hold circuit 44 as synchronization control information CNTsyc during discontinuity of a bus cycle, for example, a memory refresh cycle period or a memory write cycle period. The synchronization control information CNTsyc set to the hold circuit 44 is used in its subsequent memory read cycle. An instruction for the operation of delay time measurement by the delay time determination circuit 43 is given based on, for example, a calibration start instruction signal 30 from the external memory controller 4.

The phase shift circuit 27 is used as a variable or programmable phase shift circuit using a variable delay circuit. Since the phase shift circuit 27 performs a 90° phase shift with the cycle of the clock ckb as the reference, there is a need to perform a delay setting (delay time control or adjustment) with respect to the variable delay circuit. The delay time adjustment is performed upon, for example, a memory refresh cycle, a memory write cycle or the like when no memory read cycle occurs. For example, its operation instruction is given from the external memory controller 4 in accordance with the calibration start instruction signal

30. The 90° phase-shifted data strobe signal DQSin is expressed as DQS-90. The sampling circuit 28 samples the read data DQ using both of the rising and falling edges of DQS 90° delayed by the phase shift circuit 27.

The synchronization circuit 45 has a plurality of paths that make different the number of series stages of flip-flops each of which performs a latch operation by positive and negative clocks of the clock ckb. The synchronization circuit 45 selects one from the paths in accordance with the synchronization control information CNTsyc. Thus, the synchronization circuit 45 synchronizes data DQ (DQsmp) sampled by the sampling circuit 28 with the internal clock ckb in accordance with the synchronization control information CNTsyc measured at the delay time determination circuit 43 and sequentially updated during the discontinuity of the bus cycle, and retained in the hold circuit 44. The data DQSsyc is data obtained by synchronizing data DQsap with the internal clock (clock ckb) through the use of the synchronization circuit 45 in accordance with the output of the hold circuit 44 that retains the synchronization control information CNTsyc calculated by the 90° phase shift circuit 27 and the delay time determination circuit 43.

Figure 17:
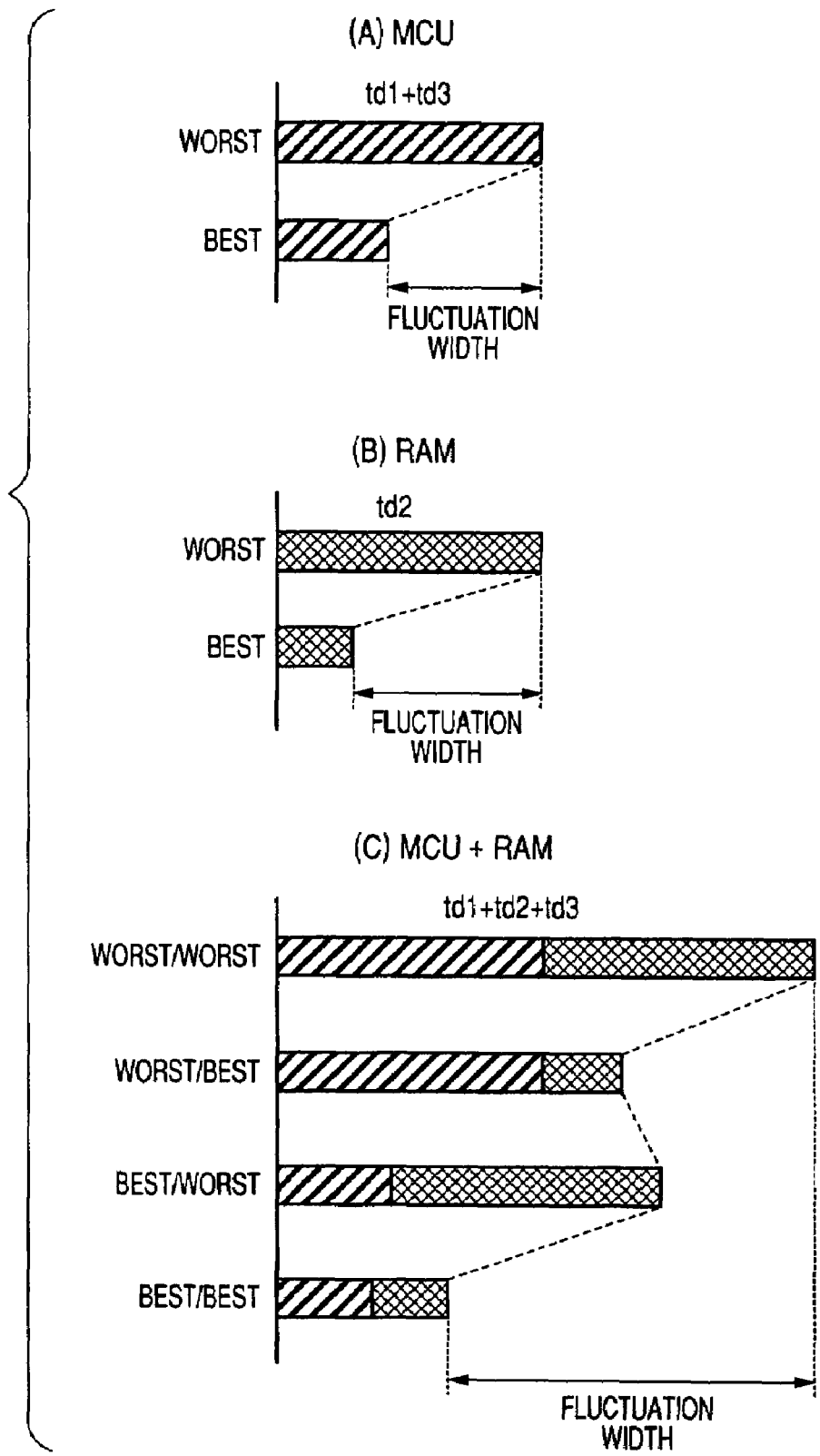
FIG. 17 is a diagram for describing delay times between the MCU and the memory.

In the present embodiment, the delay time td1 at the output of the above MCU 1 and the delay time td2 at the MB-DDR SDRAM 6 with no clock synchronization circuit are contained in the delay time (td1+td2+td3) of DQS measured by the delay time determination circuit 43. As a result, the fluctuation width of the measured delay time becomes larger as shown in FIG. 17(C), thus resulting in restriction of a clock cycle.

In order to equivalently reduce the fluctuation widths of the above delay times, a dummy input/output circuit 23, a pulse control circuit 40, a delay .time determination circuit 41 and a hold circuit 42 are provided in the present embodiment. The dummy input/output circuit 23 is called a circuit equivalent to the input circuit 15, a so-called replica circuit as to the input/output circuits 17 and 18 and the input circuit. An output terminal of the output circuit of the input/output circuit 23 and an input terminal of the input circuit thereof are connected to an external terminal 24. Although not restricted in particular, a dummy capacitance DC equivalent to an input capacitance of the MB-DDR SDRAM 6 or a capacitance further added with a capacitance equivalent to a wiring capacitance between the MCU 1 and the MD-DDR SDRAM 6 is connected to the external terminal 24.

Incidentally, the input circuits/output circuits such as the input/output circuit 23, the output circuits 15 and 16, etc. are connected to their corresponding external terminals 24, 19, 20 and the like through unillustrated pads (PADs). Each of the PADs is a metal area having a predetermined size, which is formed on the semiconductor substrate. The PADs have capacitances corresponding to their sizes and are connected by bonding or the like using lead frames and gold wirings whose parts are exposed as external terminals of the semiconductor integrated circuit device.

The pulse control circuit 40 supplies a test pulse RPout to the input of the output circuit of the input/output circuit 23. A test pulse RPin transferred through the input circuit of the input/output circuit 23 is inputted to the delay time determination circuit 41. Since the input/output circuit 23 is configured as the replica circuit as described above and the dummy capacitance CD is connected thereto, the delay time determination circuit 41 measures delay times td1+td3 of the input and output circuits of the MCU 1. The hold circuit 42 fetches the result of measurement (td1+td3) therein and sends it to the delay time determination circuit 43. The delay time determination circuit 43 performs the operation of substantially measuring a delay time td2.

Figure 2:
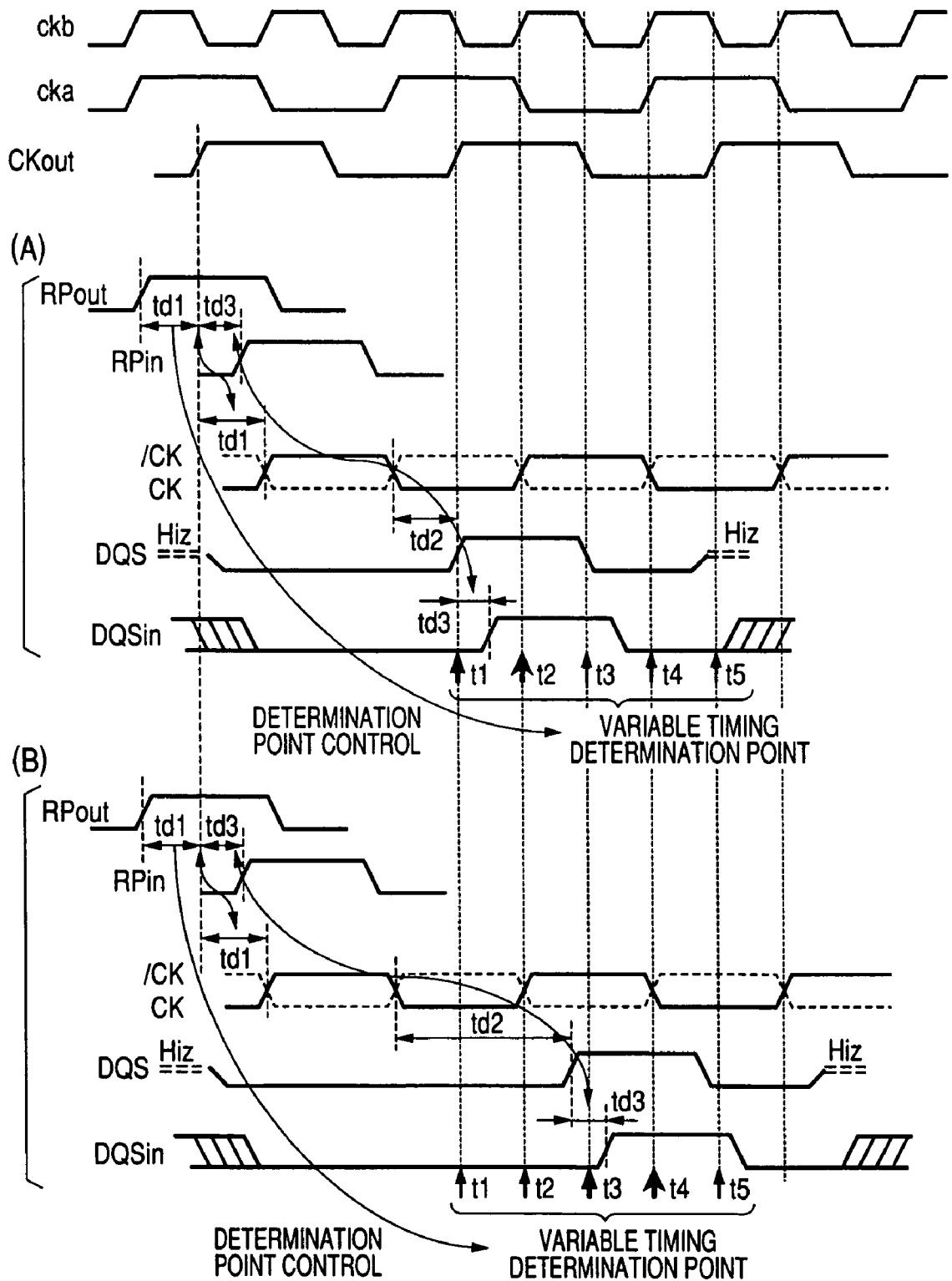
FIG. 2 is a waveform diagram for describing one example of the operation of a memory interface circuit 3 according to the present invention.

A waveform diagram for describing one example of the operation of the memory interface circuit 3 according to the present invention is shown in FIG. 2. In FIG. 2, td1 indicates a delay time from the end of each of cross points of clocks CKBout and CKout matched in timing to each of CK terminals 10 and 11 of the MB-DDR SDRAM 6 via the output circuits 15 and 16. Each of the cross points of the clocks CK and /CK at the terminals 10 and 11 is defined as a reference timing for a data strobe signal DQS and data DQ. The MB-DDR SDRAM 6 is configured so as to output data with a delay time td2 with respect to the clocks CK and /CK at the terminals 10 and 11 without incorporating a DLL circuit in an output stage for the data strobe signal DQS. A delay time td3 indicates a delay time from the DQS terminal 22 to the delay time determination circuit 43 and the phase shift circuit 27 via the input circuit 18. These delay times td1 and td3 are set so as to be equal to the delay times td1 and td3 at the dummy input/output circuit.

An example of a best/best combination of the MCU 1 and MB-DDR SDRAM 6 minimum in the delay times td1, and td3 and td2 is shown in FIG. 2(A). With such a combination as the reference, variable timing determination points t1 through t5 are set. In the same figure (A), it is detected that DQSin has changed from a low to high levels between the determination points t1 and t2. On the other hand, FIG. 2(B) shows an example of a best/worst combination in which delay times td1 and td3 at the MCU 1 are best and a delay time td2 at the MB-DDR SDRAM 6 is worst. In the present example, the delay times td1 and td3 at the MCU 1 are in a best state and the variable timing determination points t1 through td5 at the delay time determination circuit 43 are maintained as they are. Thus, the delay time determination circuit 43 detects that DQSin has changed from a low to high levels between the determination points t3 and t4 in association with the delay time td2 at the MB-DDR SDRAM 6.

Figure 3:
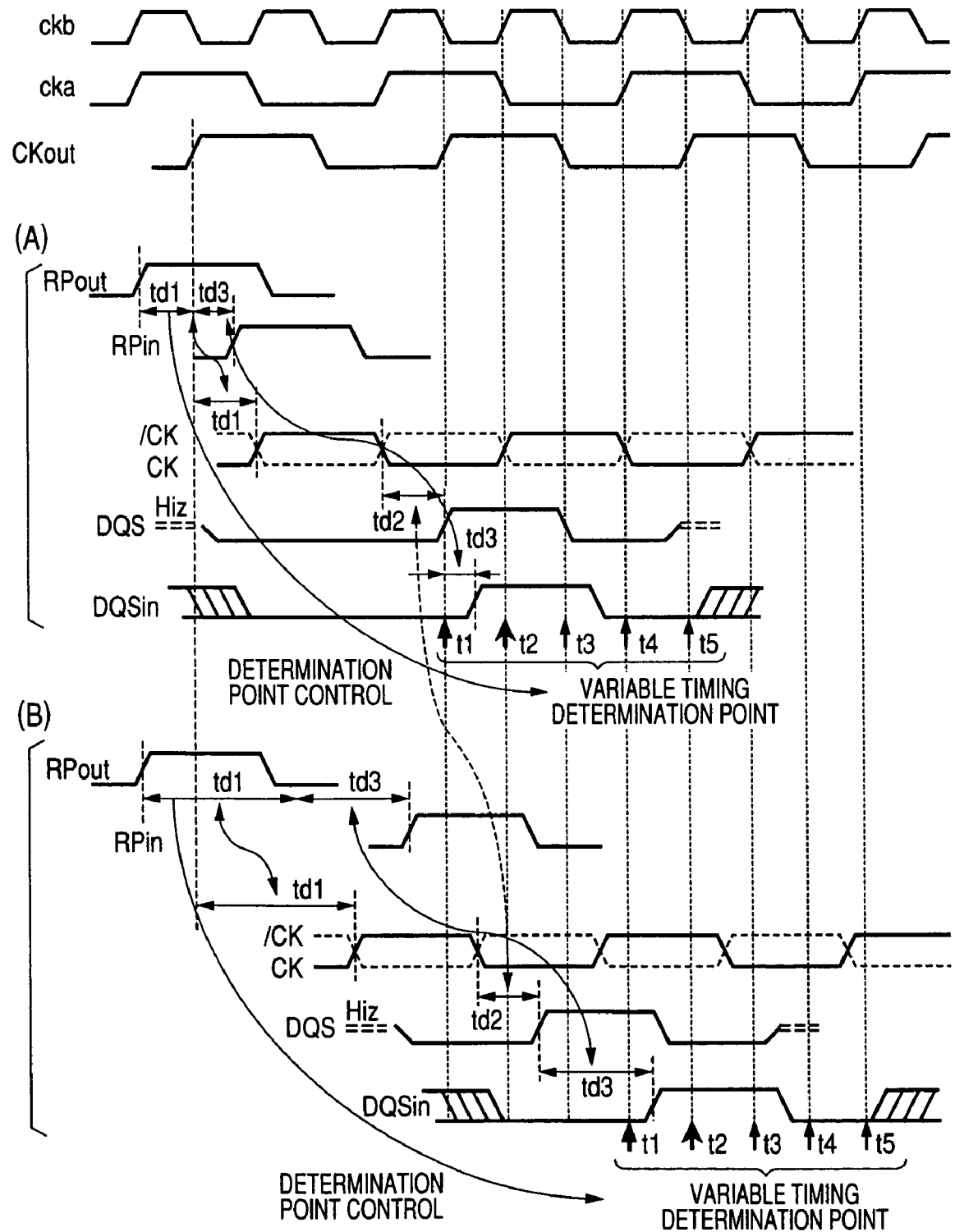
FIG. 3 is a waveform diagram for describing another example of the operation of the memory interface circuit 3 according to the present invention.

A waveform diagram for describing another example of the operation of the memory interface circuit 3 according to the present invention is shown in FIG. 3. An example of a best/best combination of the MCU 1 and MB-DDR SDRAM 6 minimum in the delay times td1, and td3 and td2 is shown in FIG. 3(A) in a manner similar to FIG. 2(A). On the other hand, FIG. 3(B) shows an example of a worst/best combination in which delay times td1 and td3 at the MCU 1 are worst and a delay time td2 at the MB-DDR SDRAM 6 is best. In the present example, the delay time determination circuit 41 determines the delay times of td1 and td3 at the MCU 1 and changes (shifts) the variable timing determination points t1 through t5 at the delay time determination circuit 43 so as to delay them by a cycle (3 points) equal to 1.5 times the cycle of the internal clock ckb in association with the result of its determination. As a result, if the original determination point t1 is held as it is, then the malfunction of fetching an undefined level of DQSin is avoided. In a manner similar to FIG. 3(A), it is detected that DQSin has changed from a low to high levels between the determination points t1 and t2. That is, while the above malfunction of determination of DQSin is being prevented in the example shown in FIG. 3(B), the result of determination by the delay time determination circuit 43 is reflected on the determination time (1.5 cycles) at the delay time determination circuit 41, whereby a synchronization operation is performed.

Figure 4:
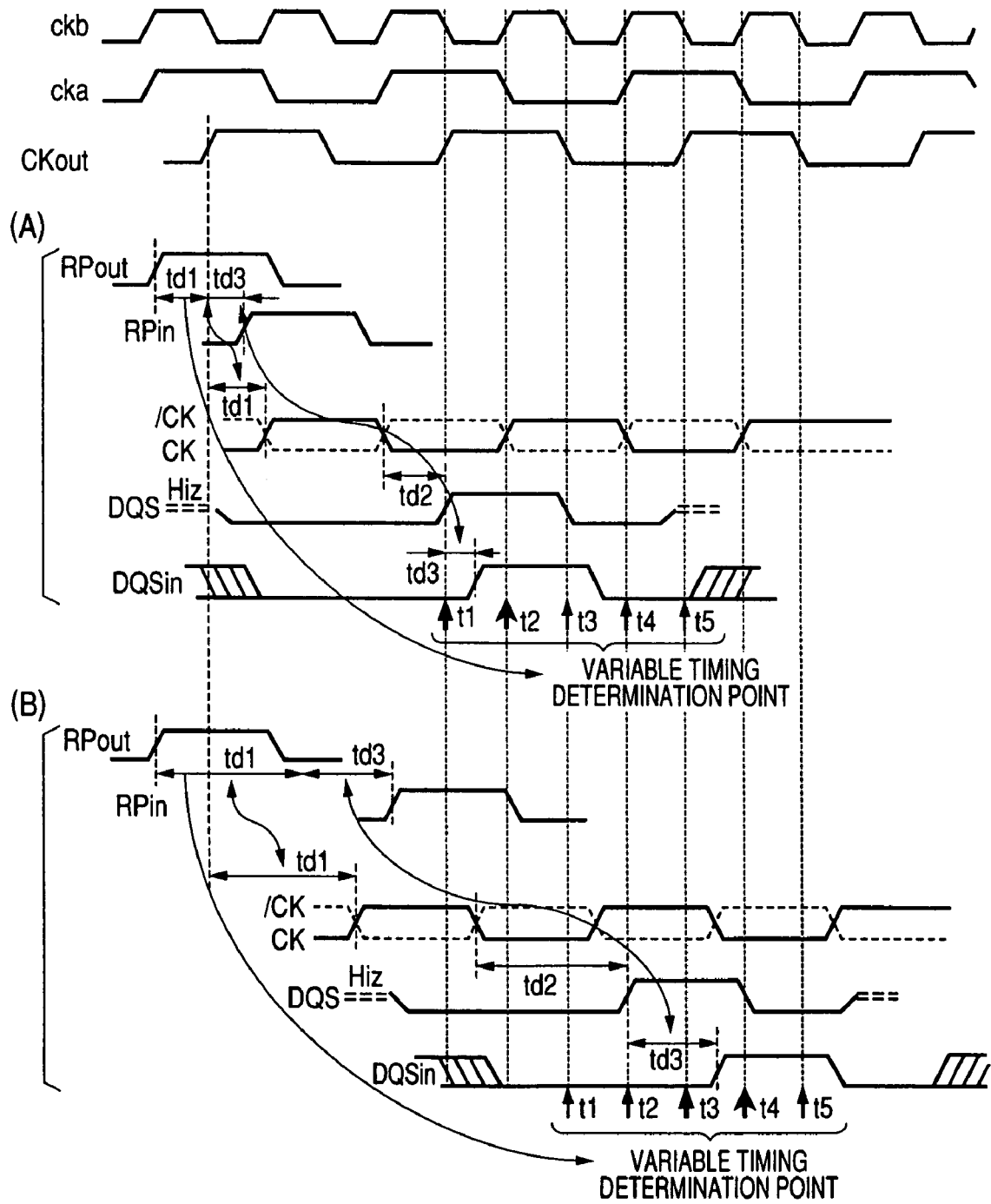
FIG. 4 is a waveform diagram for describing a further example of the operation of the memory interface circuit 3 according to the present invention.

A waveform diagram for describing a further example of the operation of the memory interface circuit 3 according to the present invention is shown in FIG. 4. An example of a best/best combination of the MCU 1 and MB-DDR SDRAM 6 minimum in the delay times td1, and td3 and td2 is shown in FIG. 4(A) in a manner similar to FIG. 2(A). On the other hand, FIG. 4(B) shows an example of a combination in which delay times td1 and td3 at the MCU 1 and a delay time td2 at the MB-DDR SDRAM 6 are both worst as compared with the best of FIG. 4(A). In the present example, the delay time determination circuit 41 determines the delay times of td1 and td3 at the MCU 1 and changes (shifts) the variable timing determination points t1 through t5 at the delay time determination circuit 43 so as to delay them by a cycle (2 points) equal to 1.0 times the cycle of the internal clock ckb in association with the result of its determination. As a result, if the original determination point t1 is held as it is, then the malfunction of fetching an undefined level of DQSin is avoided. It is further detected that DQSin has changed from a low to high levels between the determination points t3 and t4 in response to an increase in the delay time td2. That is, while the above malfunction of determination of DQSin is being prevented in the example shown in FIG. 4(B), the result of determination by the delay time determination circuit 43 is reflected on the result of determination (1.0 cycle) at the delay time determination circuit 41, whereby a synchronization operation is performed.

Figure 5:
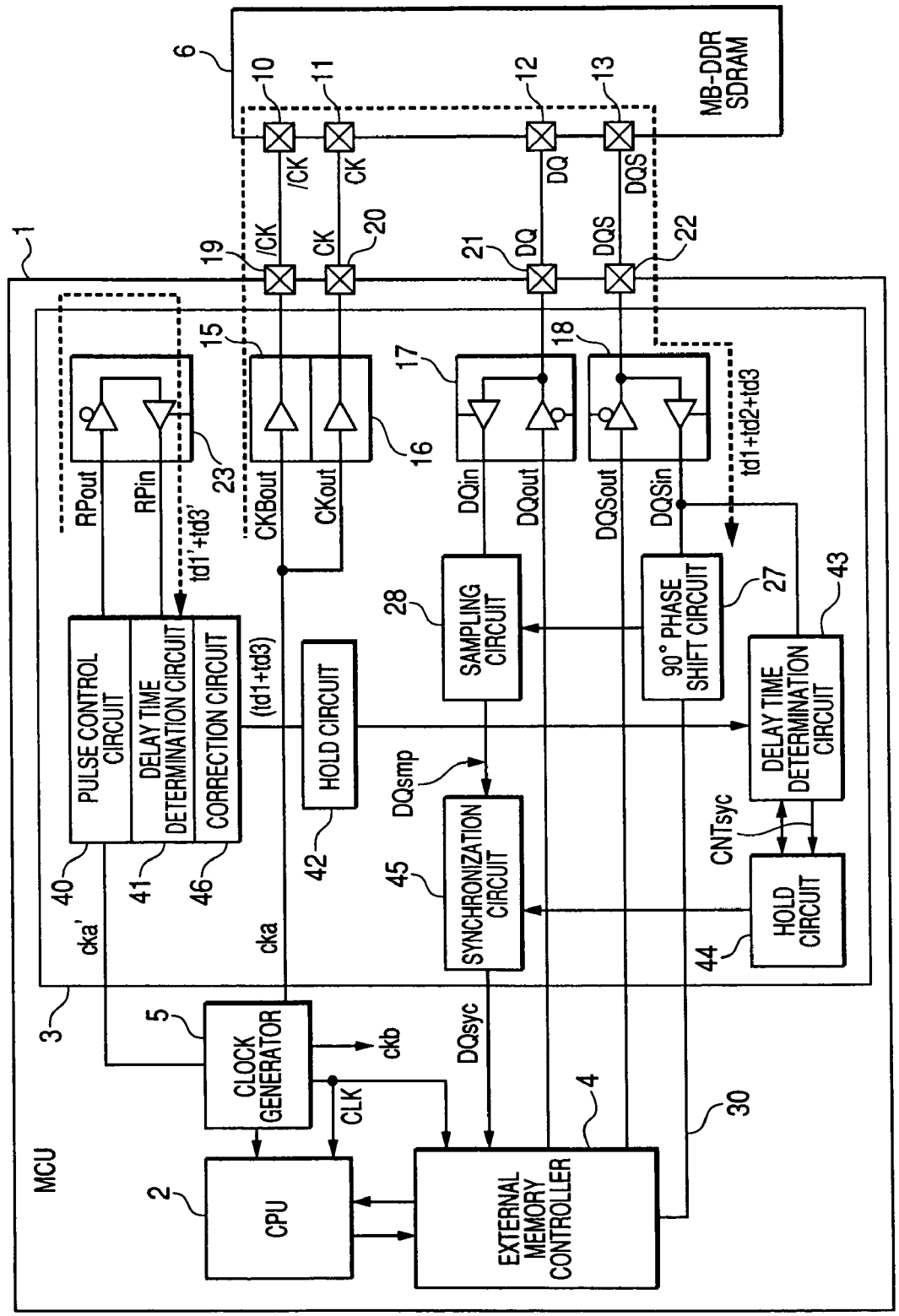
FIG. 5 is a block diagram illustrating another embodiment of a semiconductor integrated circuit device according to the present invention.
Figure 6:
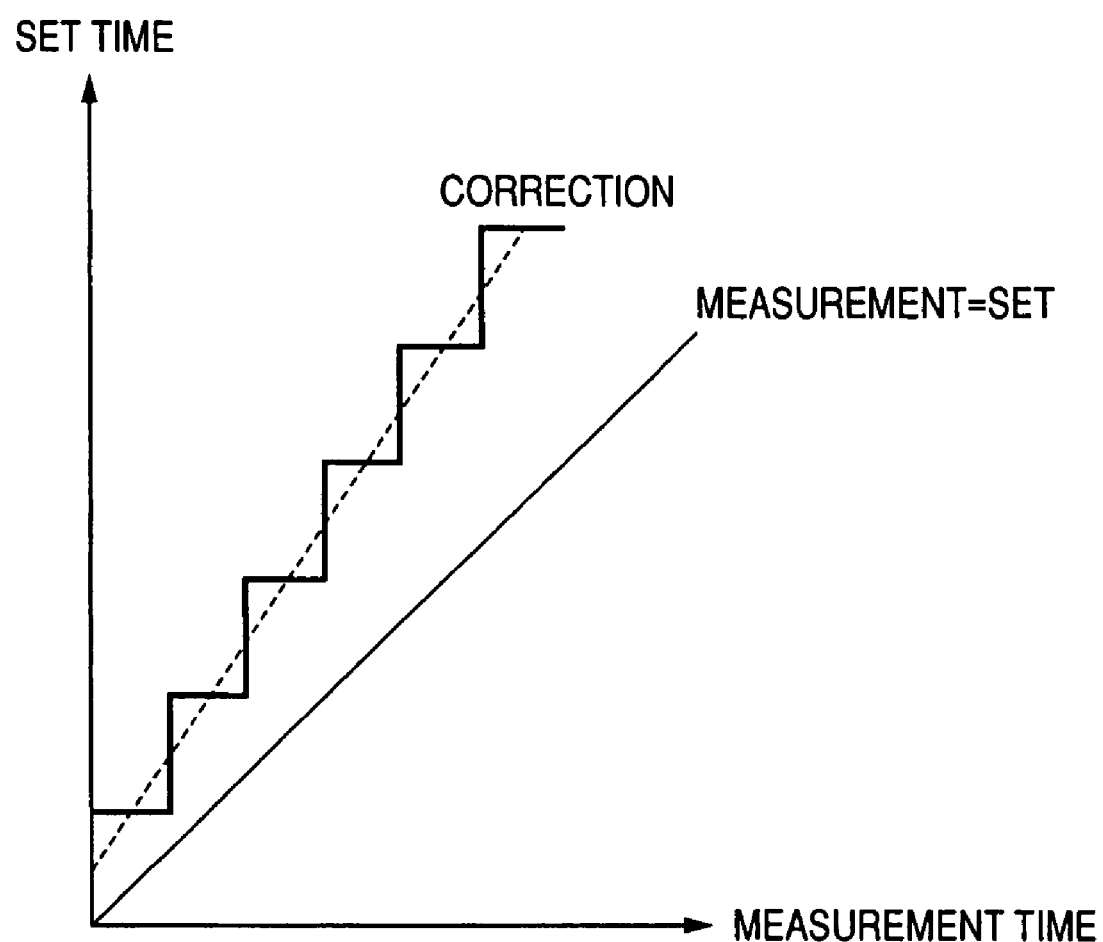
FIG. 6 is a correction explanatory diagram of one embodiment, based on a correction circuit shown in FIG. 5.

A block diagram of another embodiment of a semiconductor integrated circuit device according to the present invention is shown in FIG. 5. In the present embodiment, a dummy input/output circuit 23 is not provided with the external terminal 24. As a result, a delay time td1'+td3' of a test pulse RPin does not contain the signal delay of the dummy capacitance CD corresponding to the input capacitances of the external terminal and external device. Therefore, a correction circuit 46 is provided. The correction circuit 46 performs the operation of correcting the signal delay. As shown in FIG. 6 by way of example, a correction table is used for measurement time of a delay time determination circuit 41 or an arithmetic operation is effected thereon to add a correction value thereto, thereby forming the delay time (td1+td3) on a pseudo basis. Then, a hold circuit 46 is allowed to hold the delay time. The present embodiment is similar in other configuration to the embodiment shown in FIG. 1. According to the present configuration, the external terminal and dummy capacitance can be omitted.

Figure 7:
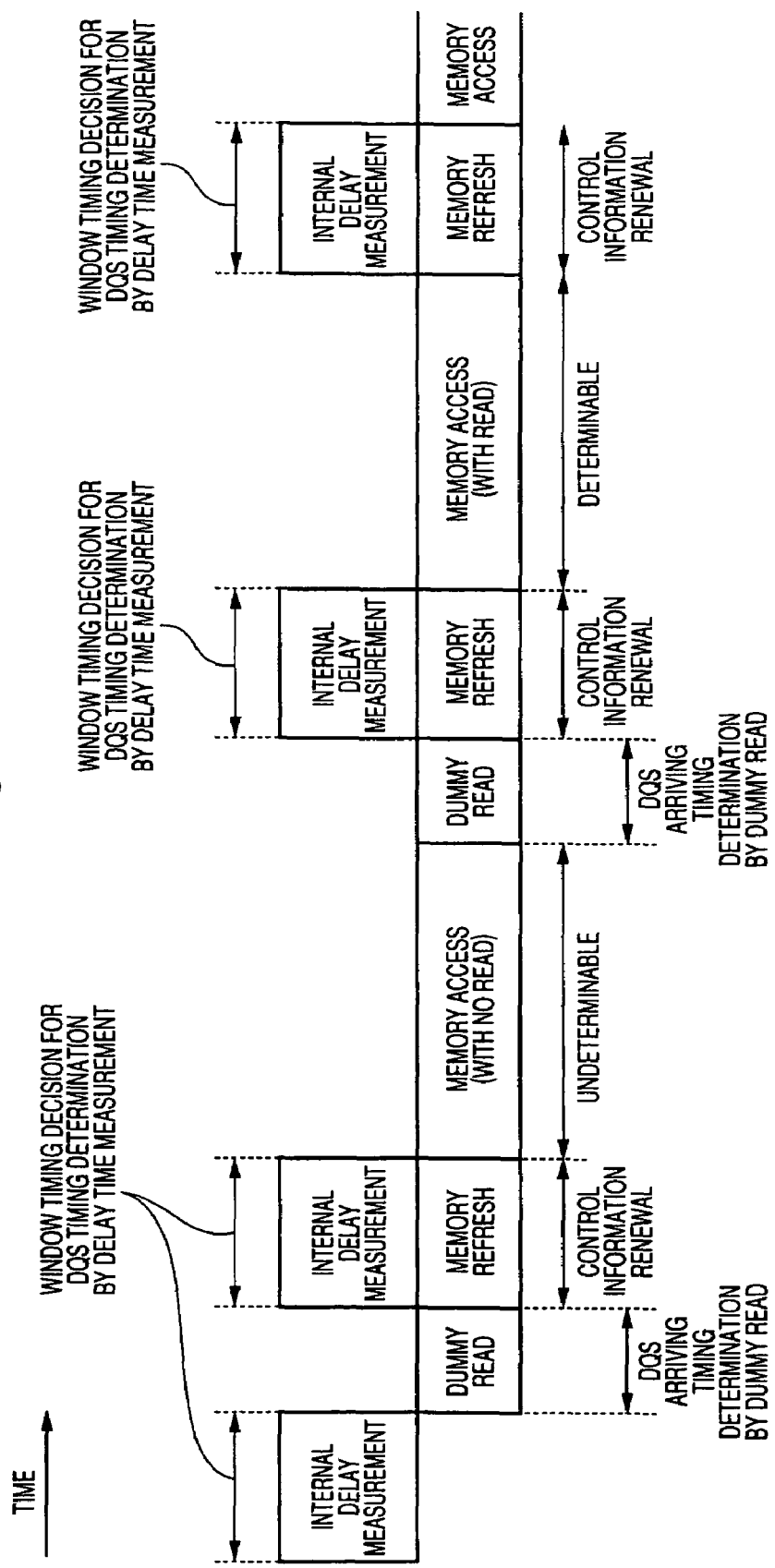
FIG. 7 is a typical explanatory diagram showing the operation of determining each delay time and the degree of renewal operation of synchronization control information, based on the result of its determination, and a memory access operation according to the present invention.

A typical explanatory diagram showing the operation of determining each delay time and the degree of renewal operation of synchronization control information, based on the result of its determination, and a memory access operation is illustrated in FIG. 7. An MB-DDR SDRAM 6 needs memory refresh set for every constant cycle in a manner similar to a normal dynamic RAM and performs a normal memory access during a period other than it. During a read access in the memory access period, a delay time determination circuit 43 makes delay time determination (DQS arrival timing determination) of a strobe signal DQS. The renewal (control information renewal) of a value held in a hold circuit 44, based on the result of determination, and an internal delay measurement using the delay time determination circuit 41 may be performed during memory refresh free of the occurrence of a memory access or during a write access free of the occurrence of a read cycle.

It is however considered that a memory read access is never made during a memory refresh interval. In such a case, the synchronization control information CNTsyc retained in the hold circuit 44 cannot be updated. In order to avoid the use of the excessively old synchronization control information CNTsyc held in the hold circuit 44, a dummy read access cycle is automatically generated immediately before the start of the memory refresh cycle when the memory read access is never made during the memory refresh interval. It is thus possible to avoid that the synchronization CNTsyc is excessively made old. The internal delay measurement and dummy read are executed upon power-on of the MCU, and the memory refresh is carried out to clear an internal state. During that time, the internal delay, the determination for the DQS determination timing and the control information renewal are carried out.

Figure 8:
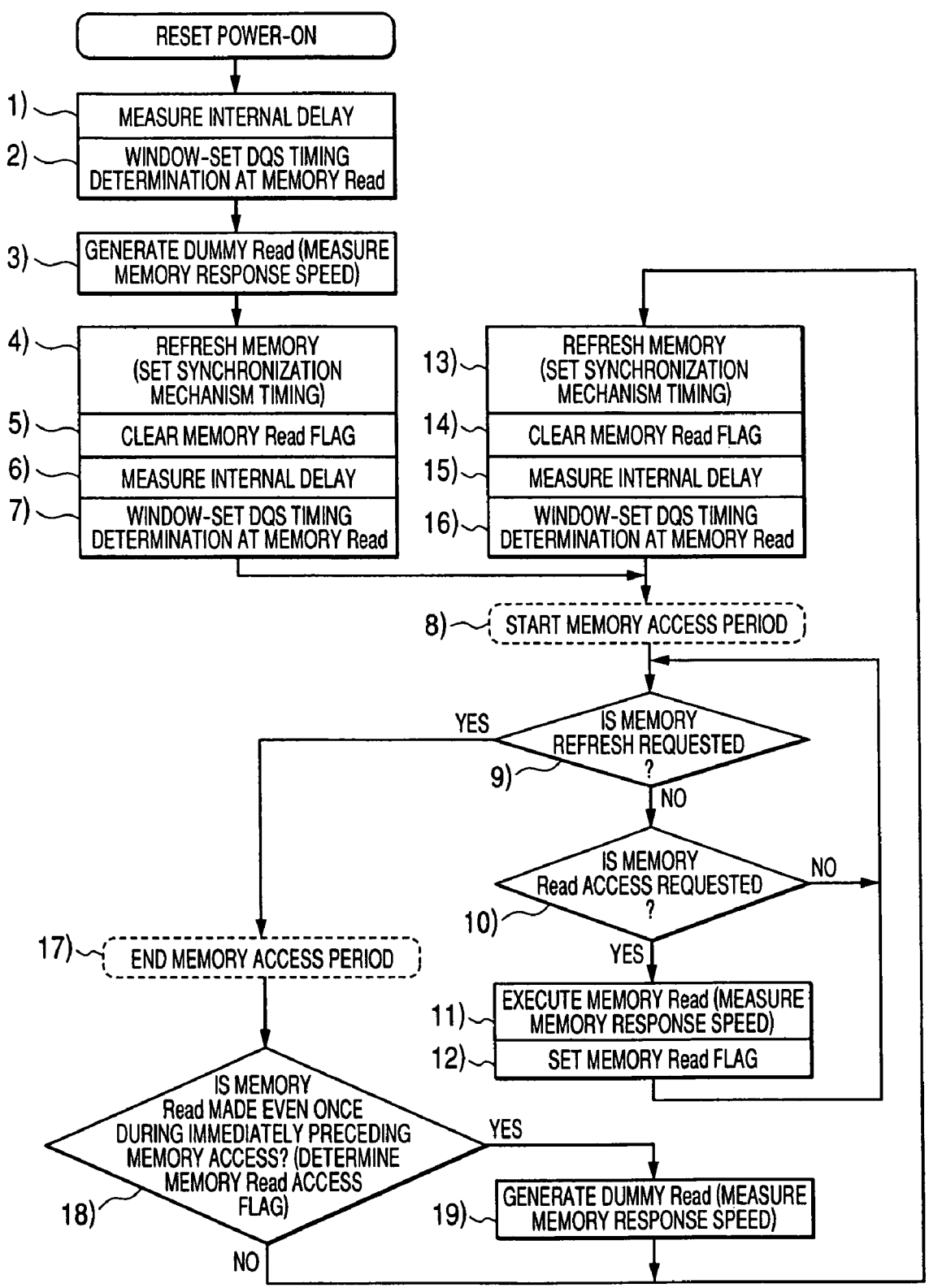
FIG. 8 is a flowchart for describing timing-adjustment operation control using delay time determination circuits 41 and 43 shown in FIG. 7.

In FIG. 8, a flow chart is shown which describes timing-adjustment operation control using the delay time determination circuits 41 and 43 shown in FIG. 7. In Step 1, an internal delay measurement by the delay time determination circuit 41, and in Step 2, window settings for DQS timing determination at memory read are carried out using the test pulse following a power-on reset. In Step 3, a dummy read cycle is generated and the operation of determination by the delay time determination circuit 43 is executed. Immediately after its execution, in Step 4, memory refresh is done. Next, in Step 5, a memory read access flag is cleared. In Step 6, the internal delay measurement, and in Step 7, window settings for DQS timing determination at memory read are carried out.

In Step 8, a memory access period start is made, and in Step 9, determination for a memory refresh request is done. If the refresh request is not made, determination for a memory read access request is then done in Step 10. If the memory read request is not made, a routine procedure for the timing-adjustment operation control is returned to Step 9. If the memory read request is found to exist, memory read is then carried out in Step 11. At this time, the measurement of a memory response speed is carried out. In Step 12, the memory read flag is set and the routine procedure is returned to Step 9 referred to above.

If the memory refresh request is made, a memory access period is then ended in Step 17. In Step 18, a memory read flag decision is made to determine whether memory read is done even once during the immediately preceding memory access period. If the memory read is found not to be done, a dummy read is then generated and the measurement for a memory response speed is made in Step 19. When the memory read is made and the dummy read is ended, memory refresh (synchronization mechanism timing setting) is carried out in Step 13. In Step 14, a memory read flag is cleared following the synchronization mechanism timing setting. In Step 15, an internal delay measurement is carried out. In Step 16, a window setting for DQS timing determination at the memory read is done. After the memory refresh, the routine procedure proceeds to Step 8 of starting memory access period.

In the present configuration, the matching of phase between the clock CK and internal clock supplied to the MB-DDR SDRAM 6 is not performed. Using the data strobe signal DQS outputted from the MB-DDR SDRAM 6, the delay times and the delay time at its own input/output operation are measured. Based on information obtained therefrom, data fetched from the MB-DDR SDRAM 6 is timing-corrected.

The measurement of each delay time of the data strobe signal DQS is done whenever necessary or during the discontinuity of a bus cycle, and the reflection of its information on a timing control mechanism is done during the memory refresh cycle or the like. Therefore, the delay time measurement and the timing for reflection of its measurement result can be restrained from becoming critical as compared with the case in which information per se about the delay time of the data strobe signal outputted upon data read is used for data timing control. When a data read cycle defined as the original information for timing measurement is never generated during the memory refresh cycle, a check is made upon startup of the memory refresh cycle, and a dummy read cycle is inserted.

Thus, since the timing DQS itself for the data strobe signal to be synchronized inside is measured by the variable timing determination window (variable timing determination points) having considered the delay times at its own input/output operation, the data strobe signal can be synchronized with the internal clock using high-reliable information that avoids a misjudgment due to the undefined level of DQS. Since the DQS signal is judged by the variable timing determination window, the timing for the operation of the MB-DDR SDRAM 6 can be recognized without concern for a problem such as reflection. Since the data strobe signal DQS outputted from the MB-DDR SDRAM 6 is measured using a signal DQS whose timing is desired to be adjusted in practice, an unnecessary error is introduced and a problem such as a critical path does not arise either. Therefore, an operating margin can be taken to the maximum and the operation can be easily stabilized. Further, since the timing measurement becomes more accurate owing to the use of the delay times at the input/output operation therefor, there is no need to provide an unnecessary design margin for an external device having no clock synchronization circuit as in the case of a general-purpose DDR SDRAM, and a faster DDR interface can be realized.

Figure 9:
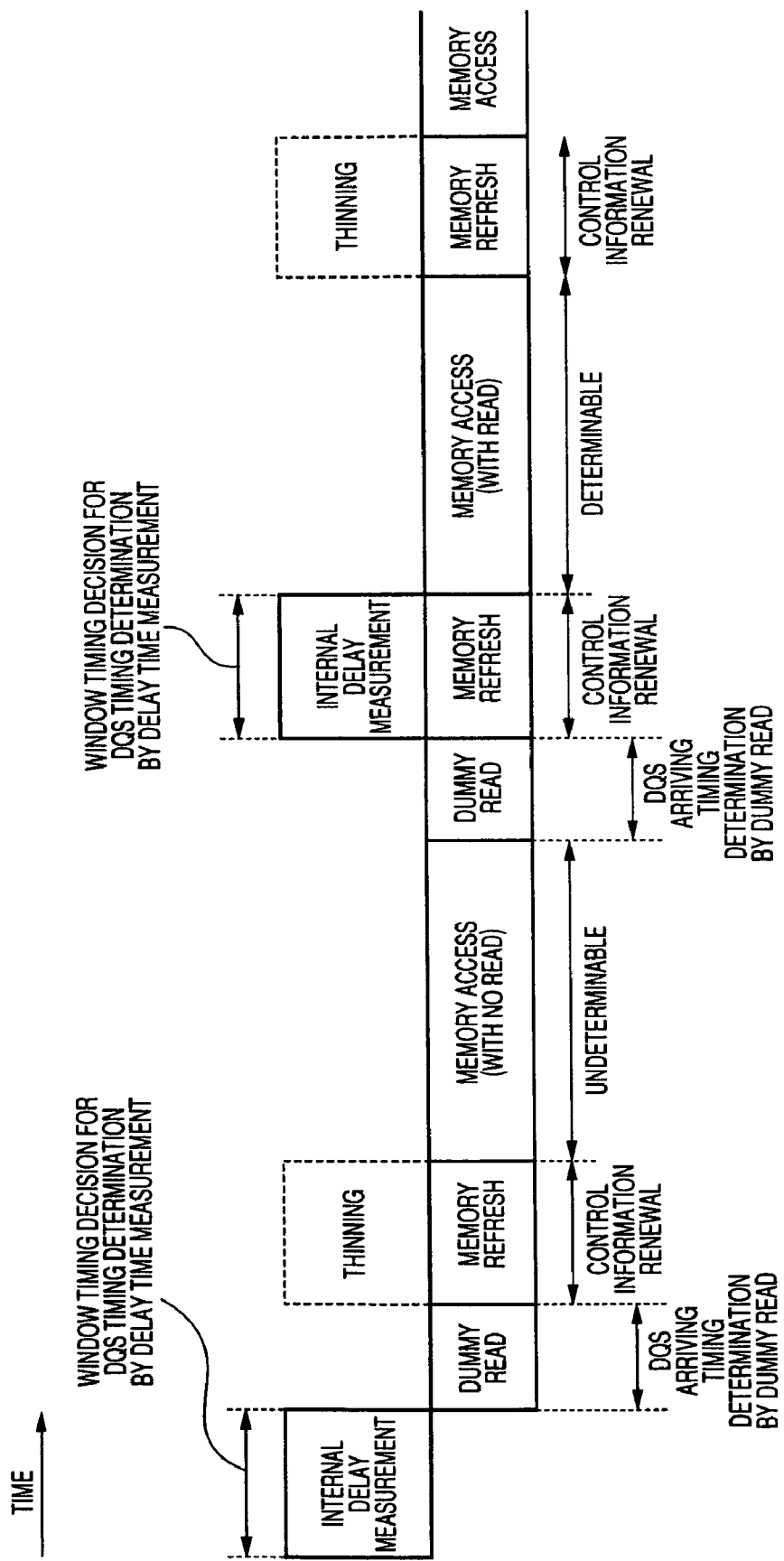
FIG. 9 is another typical explanatory diagram showing the operation of determining each delay time and the degree of renewal operation of synchronization control information, based on the result of its determination, and a memory access operation according to the present invention.

Another typical explanatory diagram showing the operation of determining each delay time and the degree of renewal operation of synchronization control information, based on the result of its determination, and a memory access operation are shown in FIG. 9. The present embodiment is a modification of the embodiment shown in FIG. 7. In the present embodiment, thinning is done for every memory refresh without performing the internal delay measurement (DQS timing setting window timing decision by delay time measurement). That is, the internal delay measurement (DQS timing setting window timing decision by delay time measurement) is carried out at the rate of once with respect to plural memory refreshes. Therefore, dummy read at the time that no read is done upon memory access is carried out under the condition that the internal delay measurement is done upon its immediately following memory refresh.

Figure 10:
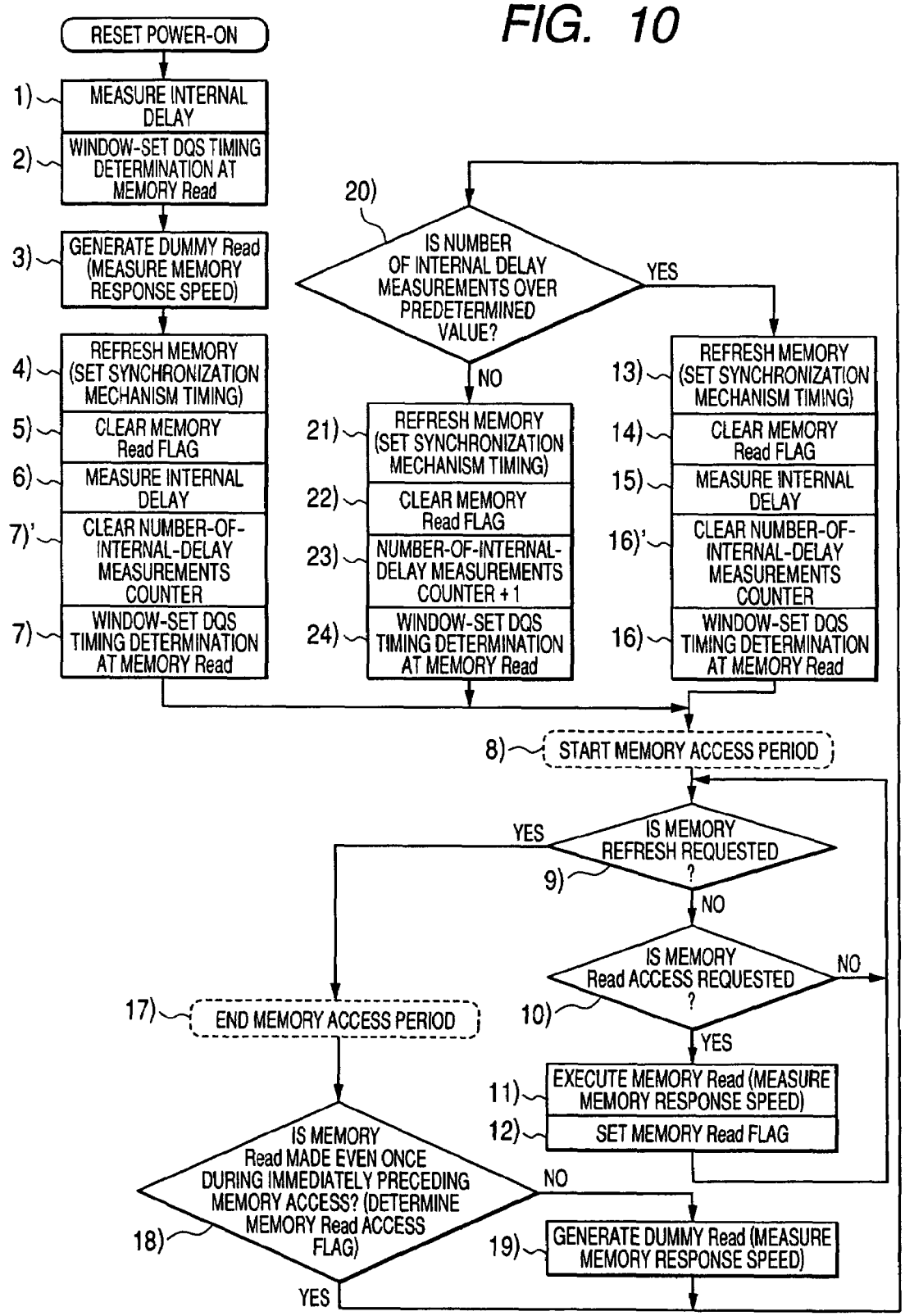
FIG. 10 is a flowchart for describing timing-adjustment operation control using delay time determination circuits 41 and 43 shown in FIG. 9.

A flowchart for describing timing-adjustment operation control using the delay time determination circuits 41 and 43 employed in the present invention is shown in FIG. 10. Steps 1 through 19 are similar to those shown in FIG. 8. In addition, in Step 7', number-of-internal-delay measurements counter clear is added after Step 6 of the internal delay measurement. Likewise, in Step 16', number-of-internal-delay measurements counter clear is added after Step 15 of measuring the internal delay. After Steps 18 and 19, it is determined whether the number of internal delay measurements has exceeded a predetermined value in Step 20. If it is found to have exceeded the predetermined value, then a routine procedure for the timing-adjustment operation control proceeds to Step 13 of memory refresh. If it is found not to have exceeded the predetermined value, then in Step 21, memory refresh (synchronization mechanism timing setting) is carried out. As the synchronization mechanism timing setting, memory read flag clear is carried out in Step 22, number-of-internal-delay measurements counter+1 is carried out in Step 23, and window-setting for DQS timing determination at memory read is carried out in Step 24, and the routine procedure proceeds to Step 8 in which memory access period starts.

Figure 11:
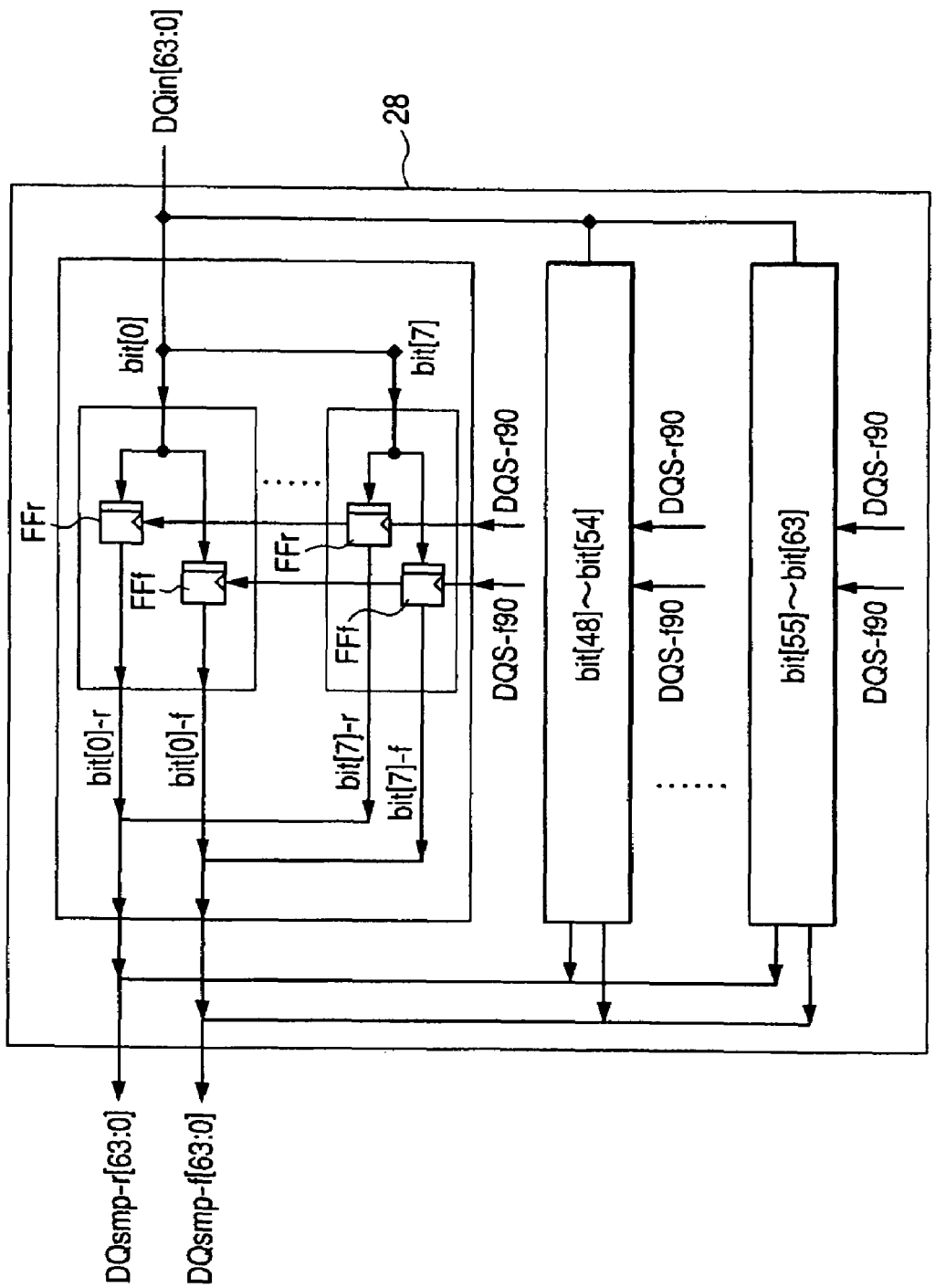
FIG. 11 is a block diagram showing a specific example of a sampling circuit 28 employed in the present invention.

A specific example of the sampling circuit 28 employed in the present invention is shown in FIG. 11. Data DQ is expressed in 64 bits, for example. An input is given as DQin [63:0]. The input is latched in discrete flip-flop circuits FFr and FFf on the rising edge DQS-r90 of a 90° phase-shifted signal DQS-90 and the falling edge DQS-f90 thereof to effect sampling on the respective bits. DQS-f90 is a fall edge synchronizing pulse of the phase-shifted signal DQS-90, and DQS-r90 is a rise edge synchronizing pulse of the phase-shifted signal DQS-90. The output of the sampling circuit 28 is outputted as data DQsmp-r[63:0] synchronized on the rising edge and data DQsmp-f[63:0] synchronized on the falling edge.

Figure 12:
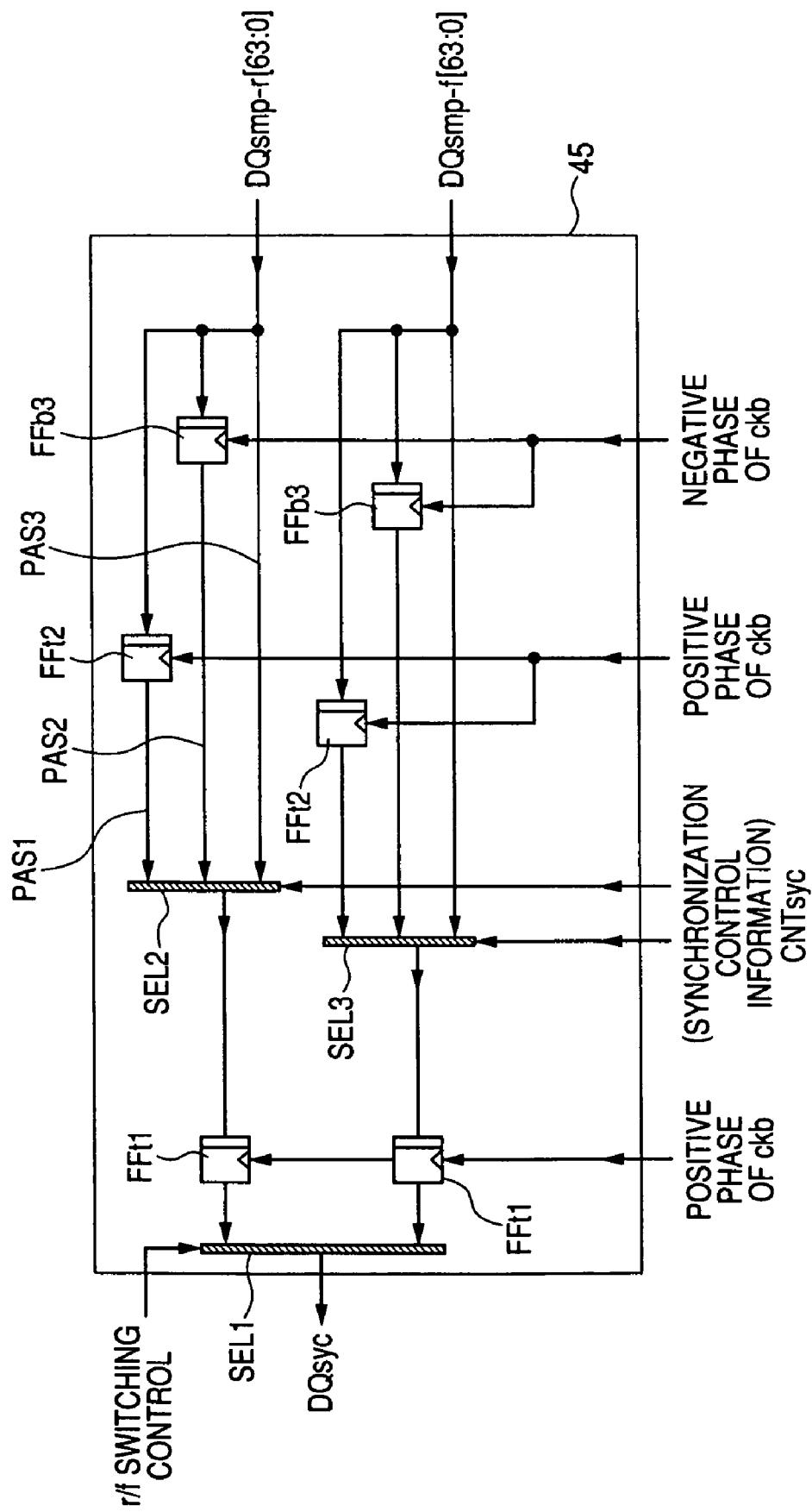
FIG. 12 is a block diagram illustrating a specific example of a synchronization circuit 45 employed in the present invention.

A specific example of a synchronization circuit 45 employed in the present invention is shown in FIG. 12. The synchronization circuit 45 synchronizes the data DQsmp-r [63:0] and DQsmp-f[63:0] outputted from the sampling circuit 28 with an internal clock ckb in accordance with synchronization control information CNTsyc in a variable delay FIF0. FFt1 indicates a flip-flop which performs a latch operation on the rising edge of a positive phase clock of ckb, FFt2 indicates a flip-flop which performs a latch operation on the rising edge of the positive phase clock of ckb, and FFb3 indicates a flip-flop which performs a latch operation on the rising edge of a reverse or positive phase clock of ckb, respectively. SEL1, SEL2 and SEL3 are selectors respectively. The selectors SEL2 and SEL3 are capable of selecting paths PAS1, PAS2 and PAS3 in accordance with the synchronization control information CNTsyc outputted from the hold circuit 44. The selector SELL alternately selects the inputs in sync with rise/fall switching control.

The selection of the inputs is switched depending on, for example, high and low levels of cka. When the arrival of the data DQ is the earliest with respect to the internal clock in light of the delay times determined by the delay time determination circuits 41 and 43, the path PAS1 is selected and thereby the outputs from the selectors SEL2 and SEL3 are delayed one cycle of ckb and synchronized with the internal clock ckb. When the arrival of the data DQ is made late a little more, the path PAS2 is selected and the outputs are delayed a ½ cycle of ckb. When the arrival thereof is made later, the path PAS3 is selected and the outputs are made without via unnecessary delays. The outputs of the selectors SEL2 and SEL3 are synchronized with ckb at the FFt1 and latched therein. Thus, DQsyc is supplied to its corresponding subsequent stage as data synchronized with ckb.

Figure 13:
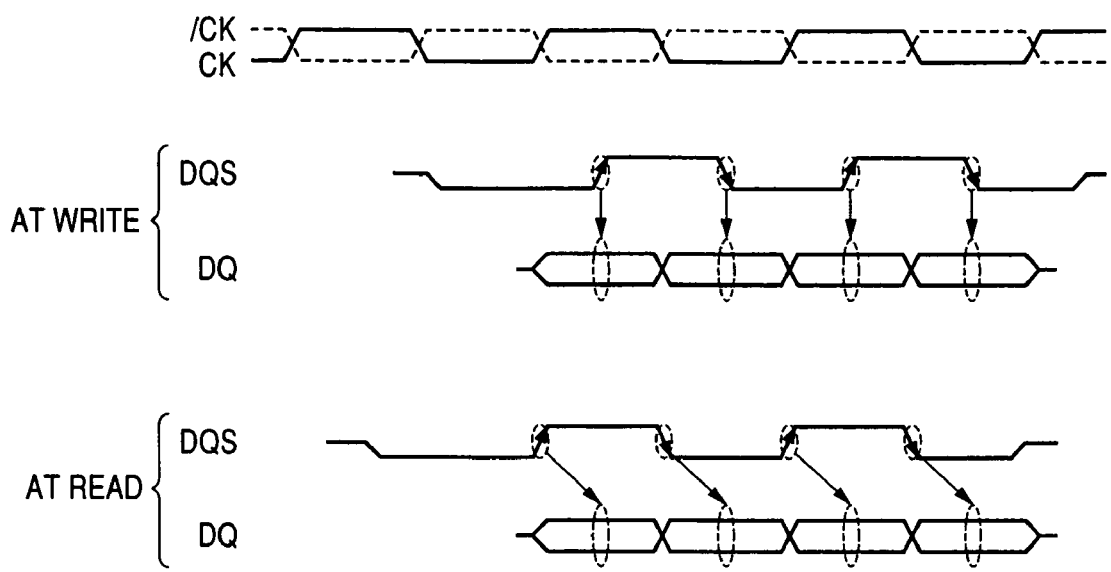
FIG. 13 is a diagram for describing data DQ and a data strobe signal DQS at write access and read access to an MB-DDR SDRAM employed in the present invention.

The relationship between data DQ and a data strobe signal DQS at write access and read access to the MB-DDR SDRAM is shown in FIG. 13. At the write access, the data strobe signal DQS is outputted with being delayed 90° in phase with respect to the data DQ. The MB-DDR SDRAM 6 having received it samples the data DQ in sync with the edge of the data strobe signal DQS. At the read access, the MB-DDR SDRAM 6 outputs the data DQ and the data strobe signal DQS simultaneously. The interface circuit 3 receives them as described above and samples the data DQ in accordance with the 90° phase-delayed data strobe signal DQS-90.

Figure 14:
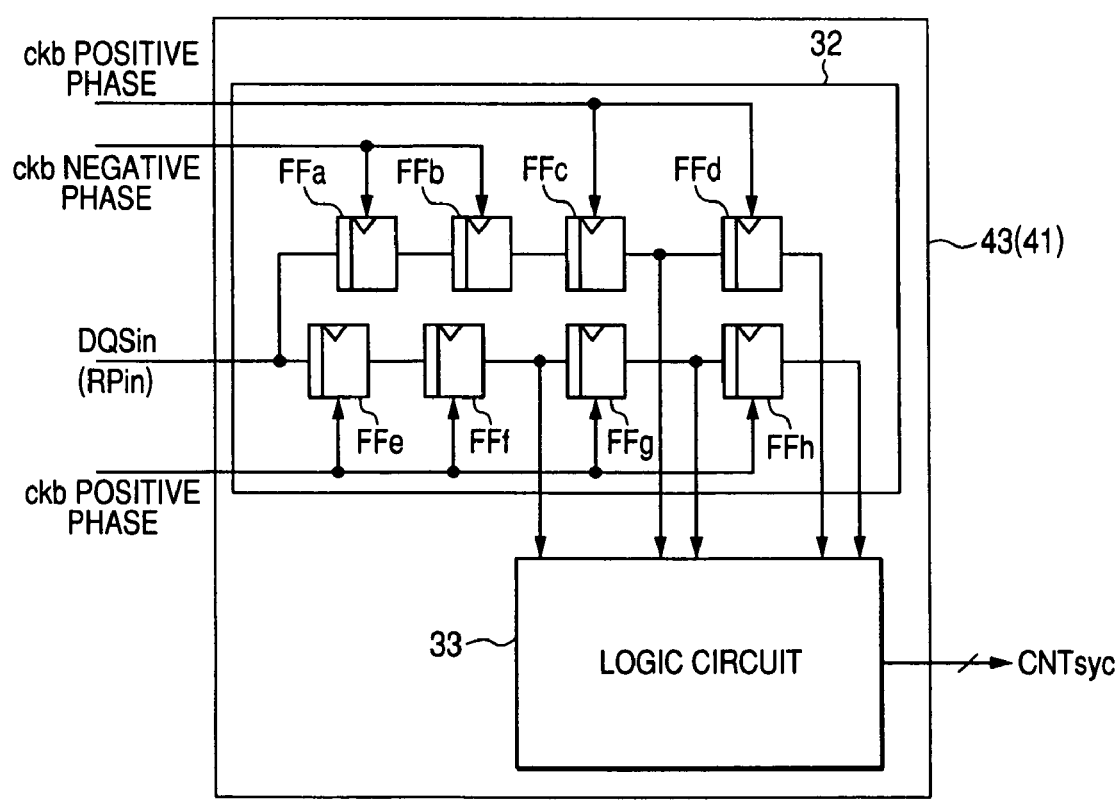
FIG. 14 is a block diagram showing one example of a delay time determination circuit 43 employed in the present invention.

One example of the delay time determination circuit 43 is shown in FIG. 14. The delay time determination circuit 43 comprises a flip-flop type series circuit 32 and a logic circuit 32 that determines each delay time from the output of the series circuit 32 and outputs 2-bit synchronization control information CNTsyc. The series circuit 32 has a four-stage series circuit constituted of flip-flops FFa, FFb, FFc and FFd, and a four-stage series circuit constituted of flip-flops FFe, FFf, FFg and FFh. Each of the flip-flops FFa and FFb performs a latch operation on the rising edge of a negative phase clock (ckb negative phase) of ckb. Each of the flip-flops FFc through FFh performs a latch operation on the rising edge of a positive phase clock (ckb).

The logic circuit 33 inputs the outputs of the FFc, FFd, FFf, FFg and FFh and determines at which timing fetched data DQSin is changed to 1 with respect to ckb. The logic circuit 33 outputs the result of determination to the hold circuit 26 as the 2-bit synchronization control information CNTsyc. Likewise, the delay time determination circuit 41 also determines at which timing fetched data RPin is changed to 1 with respect to ckb. The number of stages of these flip-flops is selected according to the relationship between the cycle of the clock ckb and the delay times td1+td3 and td2.

Figure 15:
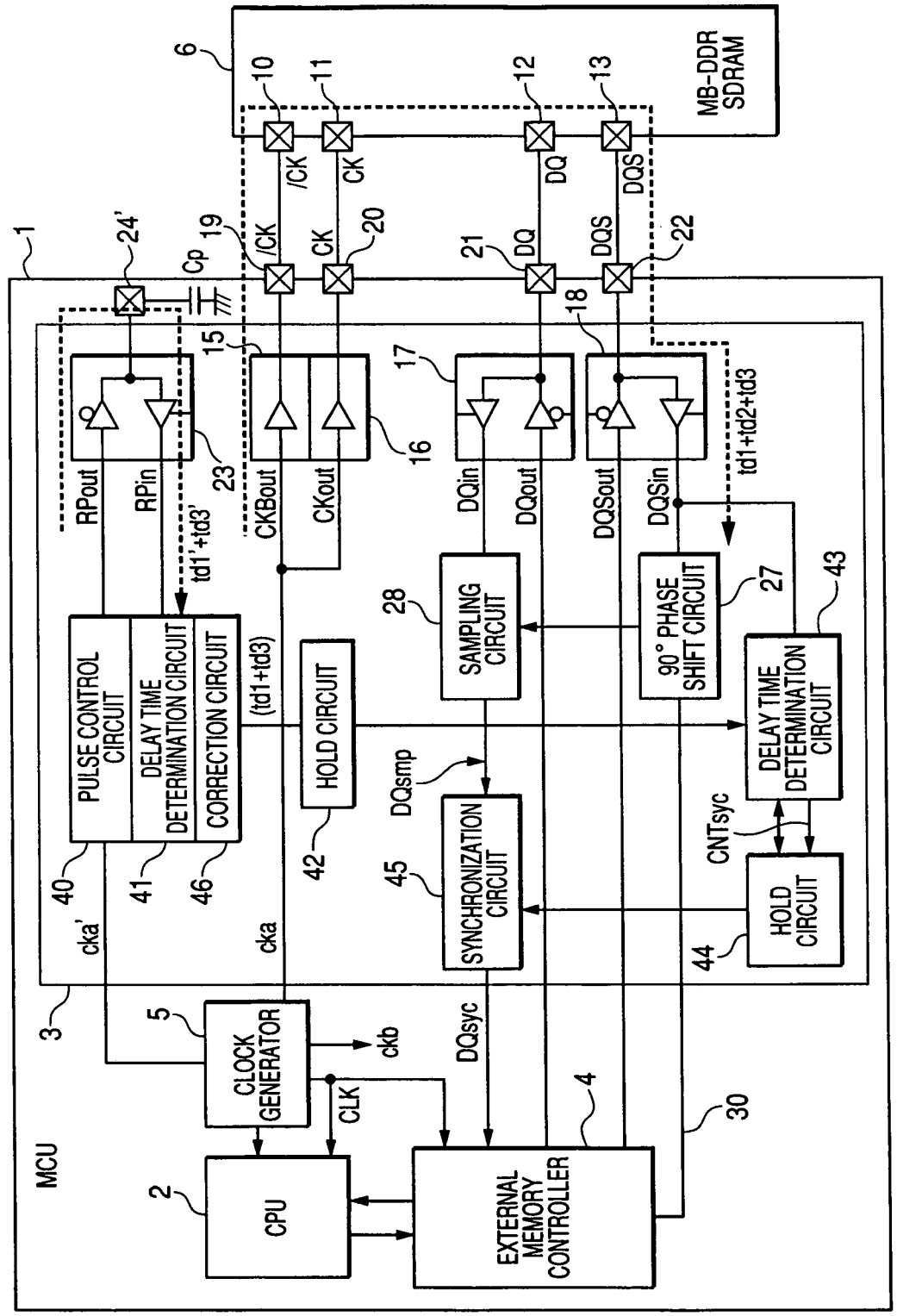
FIG. 15 is a block diagram illustrating another embodiment of a semiconductor integrated circuit device according to the present invention.
Figure 16:
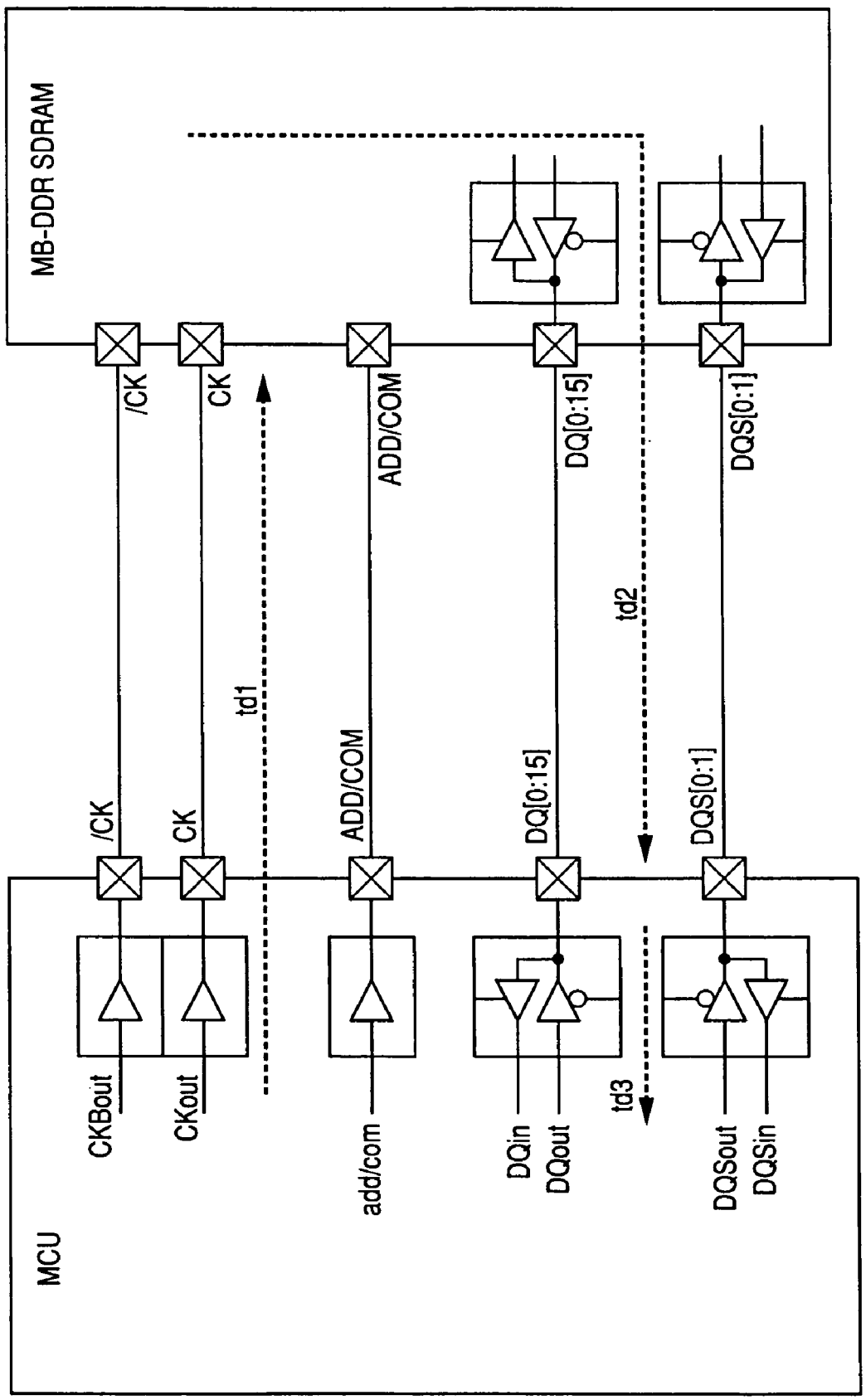
FIG. 16 is a connection diagram of an MCU and a memory discussed prior to the present invention.

A block diagram of another embodiment of a semiconductor integrated circuit device according to the present invention is shown in FIG. 15. In the present embodiment, a dummy input/output circuit 23 is connected to a pad (PAD) 24' provided on a semiconductor substrate. Since the pad 24' per se has a parasitic capacitance Cp, a capacitance Cp is connected to the pad 24' on a pseudo basis in the same figure. This capacitance Cp may be one that contains a capacitance formed on the semiconductor substrate. It is also considered that the parasitic capacitance of the pad 24' and the capacitance formed on the semiconductor substrate can be formed only at a small capacitance as compared with the capacitance DC connected to the outside. In such a case, the delay time (td1+td3) may be formed with respect to the delay time td1'+td3' by correction based on such a correction value as described in the embodiment of FIG. 5.

Figure 19:
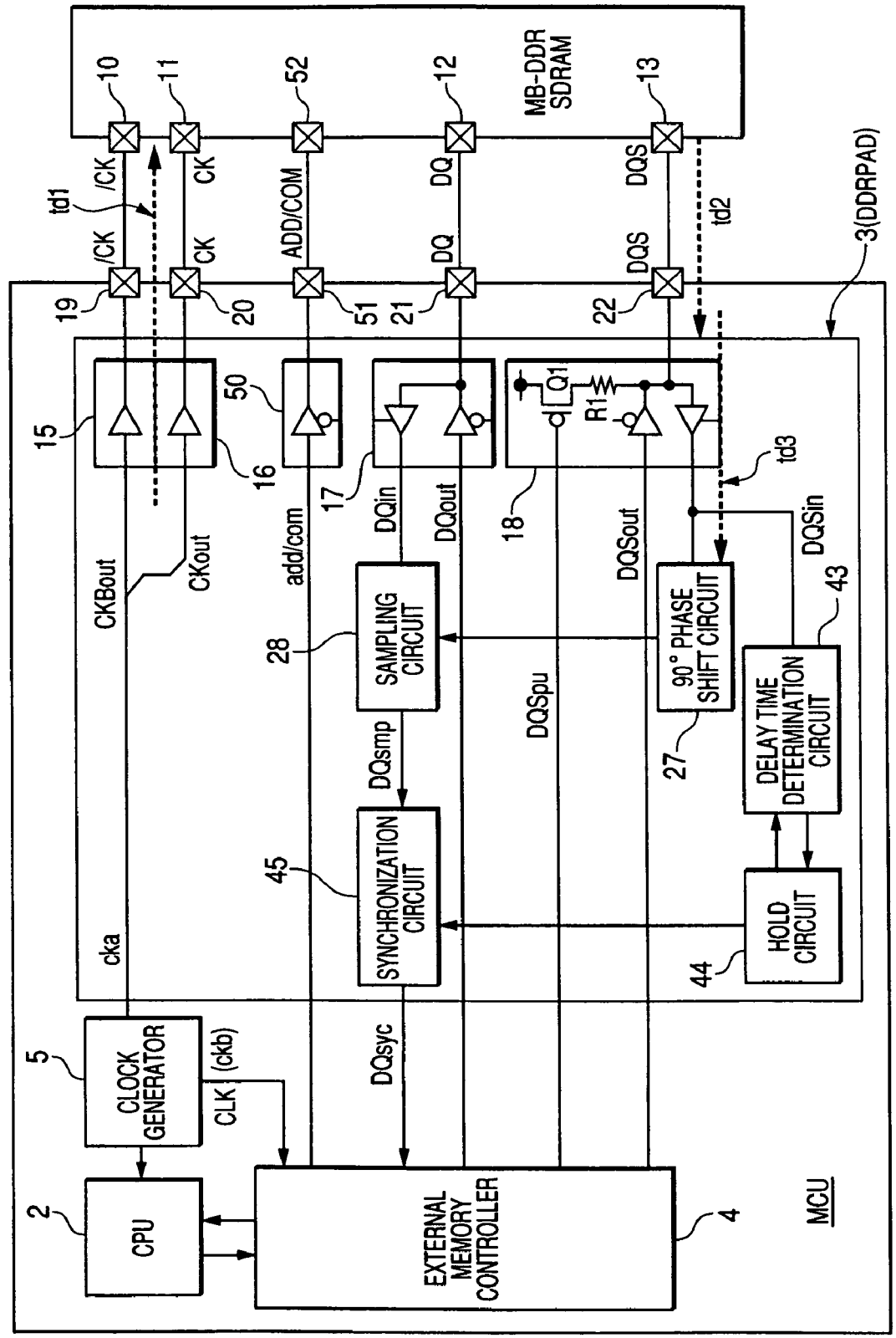
FIG. 19 is a block diagram showing a further embodiment of a semiconductor integrated circuit device according to the present invention.

A block diagram showing a further embodiment of a semiconductor integrated circuit device according to the present invention is shown in FIG. 19. In the present embodiment, such dummy input/output circuits 23 as shown in FIGS. 1, 5 and 15 are omitted. Correspondingly, the pulse control circuit 40, delay time determination circuit 41 and correction circuit 46, and hold circuit 42 are also omitted. As an alternative to it, a pull-up circuit is added to an input/output circuit 18 for a data strobe signal DQS. That is, a resistor R1 and a P channel MOSFET Q1 are provided in series configuration between an external terminal 22 and a source voltage. The gate of the MOSFET Q1 is supplied with a pull-up control signal DQSpu formed by an external memory controller 4. An output circuit 50 for outputting addresses ADD, a command COM, etc. and its external terminal 51, which are omitted in FIGS. 1, 5 and 15, are also shown in the same figure.

Figure 20:
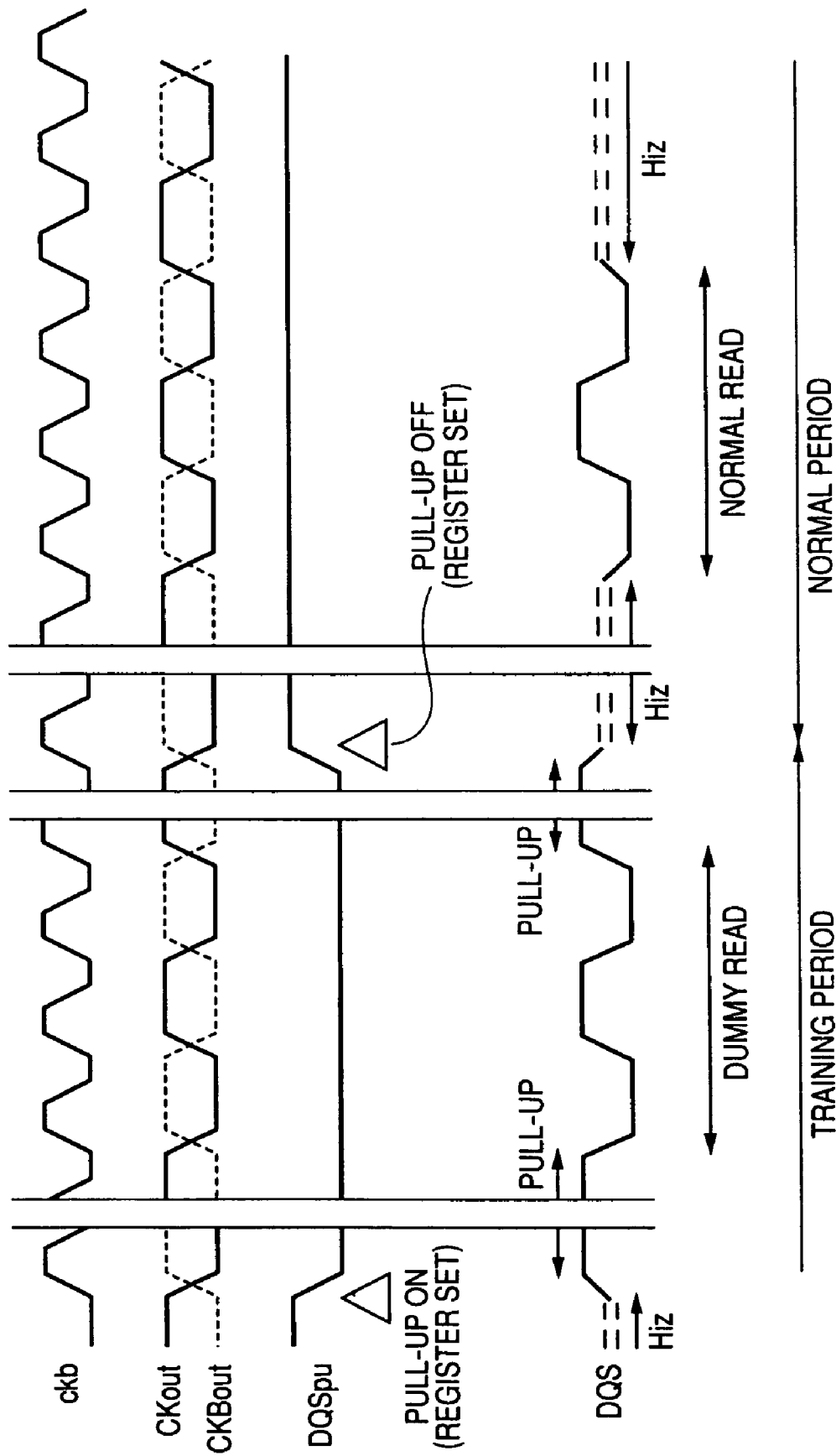
FIG. 20 is a waveform diagram for describing the operation of a memory interface circuit 3 shown in FIG. 19.

In FIG. 20, a waveform diagram is shown which describes one example of the operation of the memory interface circuit 3 of FIG. 19. A training period is provided immediately after power-on. The external memory controller 4 brings the pull-up control signal DQSpu to a low level when it enters the training period. Thus, the MOSFET Q1 is brought to an on state to pull up the external terminal 22 to a high level. That is, a signal DQS is fixed from an undefined level at high impedance HiZ to the high level by the pull-up. Dummy read is executing during the training period. When the training period is ended and a normal period is reached, the pull-up control signal DQSpu is returned to the high level. Thus, when MCU does not perform an output operation or MB-DDR SDRAM does not perform an output operation, the signal DQS becomes an undefined level at the high impedance HiZ during the normal period at the external terminal 22. When the writing of data from MCU to MB-DDR SDRAM is done during the normal period, the output circuit of the input/output circuit 18 is brought to an operation state, so that a data strobe signal DQS for a write operation is outputted. When the reading of data from MB-DDR SDRAM to MCU is performed in reverse, the data strobe signal DQS sent from MB-DDR SDRAM is inputted to the input circuit of the input/output circuit 18.

In addition to the provision of the training period immediately after power-on, the training period is performed at dummy read inserted prior to such memory refresh as shown in FIGS. 7 and 9, or the training period is provided before MCU starts a signal processing operation after the end of a low power consumption mode like a sleep mode or a standby mode and performs memory access. Alternatively, when the operating condition (source voltage or temperature) at MCU or MB-DDR SDRAM referred to above changes greatly or a memory error often occurs, the training period may be provided. Thus, the training period may be set as needed in consideration of the memory access operation.

Figure 21:
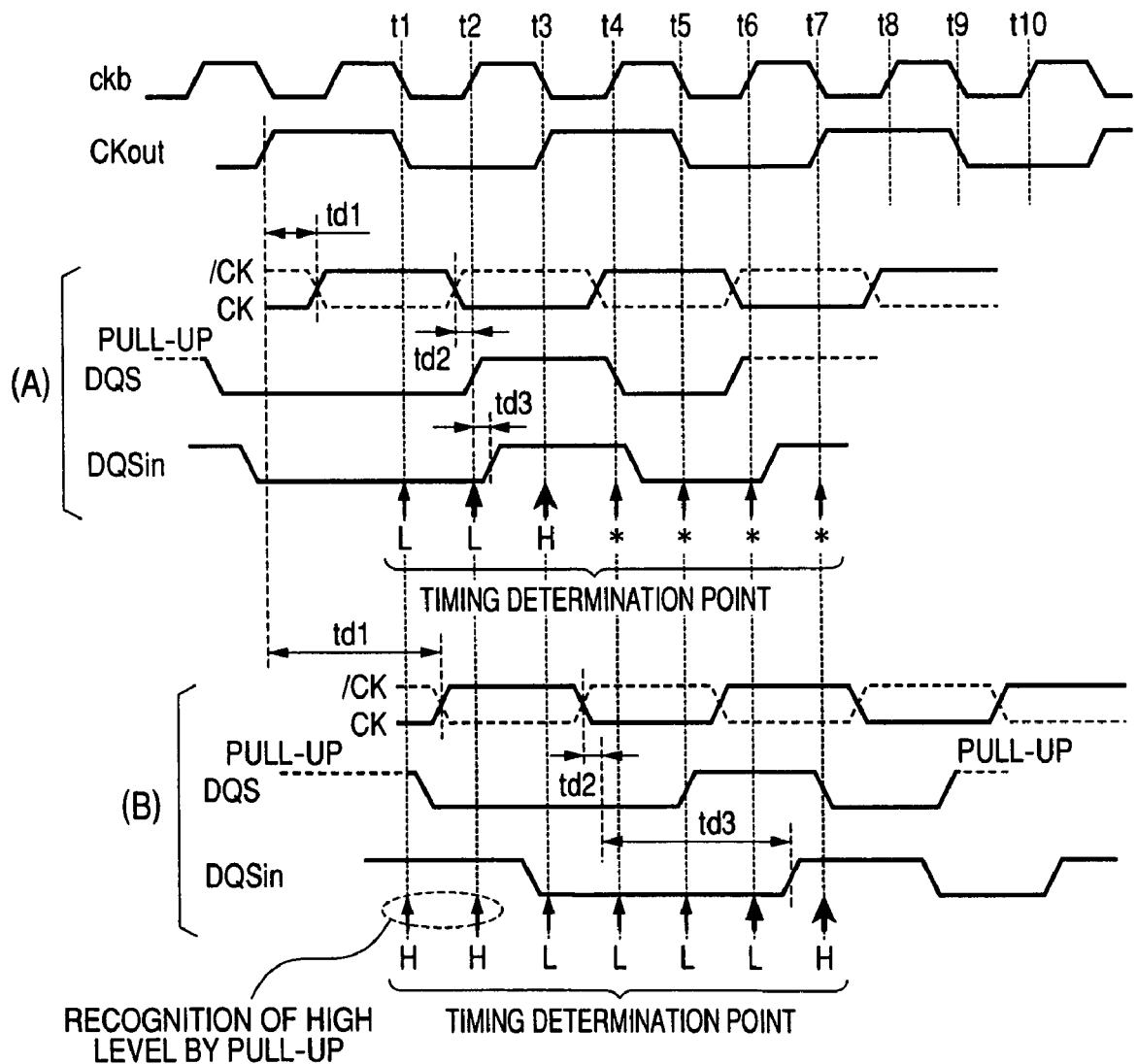
FIG. 21 is a waveform diagram for explaining one example of a training operation of the memory interface circuit 3 shown in FIG. 19.

A waveform diagram for describing one example of a training operation of the memory interface circuit 3 of FIG. 19 is shown in FIG. 21. In FIG. 19, td1 indicates a delay time from the end of each of cross points of clocks CKBout and CKout matched in timing in a manner similar to the above to each of CK terminals 10 and 11 of the MB-DDR SDRAM 6 via each of output circuits 15 and 16. Each of cross points of clocks CK and /CK at the terminals 10 and 11 becomes a reference timing for each of a data strobe signal DQS and data DQ. The MB-DDR SDRAM 6 does not incorporate a DLL circuit in an output stage for the data strobe signal DQS and is configured so as to output with a delay time td2 with respect to the clocks CK and /CK at the terminals 10 and 11. A delay time td3 indicates a delay time from a DQS terminal 22 to a delay time determination circuit 43 and a phase shift circuit 27 via an input circuit 18.

An example of a best/best combination of MCU and MB-DDR SDRAM minimum in the delay times td1 and td3, and td2 is shown in FIG. 21(A). An example of a worst/best combination in which delay times td1 and td3 at MCU are worst and a delay time td2 at MB-DDR SDRAM is best, is shown in FIG. 21(B). Since the signal DQS is pulled up and rendered high in level during the training period as mentioned above in the present embodiment, the above-described undefined level of signal DQS does not exist. Therefore, there is no need to vary determination points so as to avoid the undefined level. Thus, the number of the determination points is not limited as mentioned above.

Figure 18:
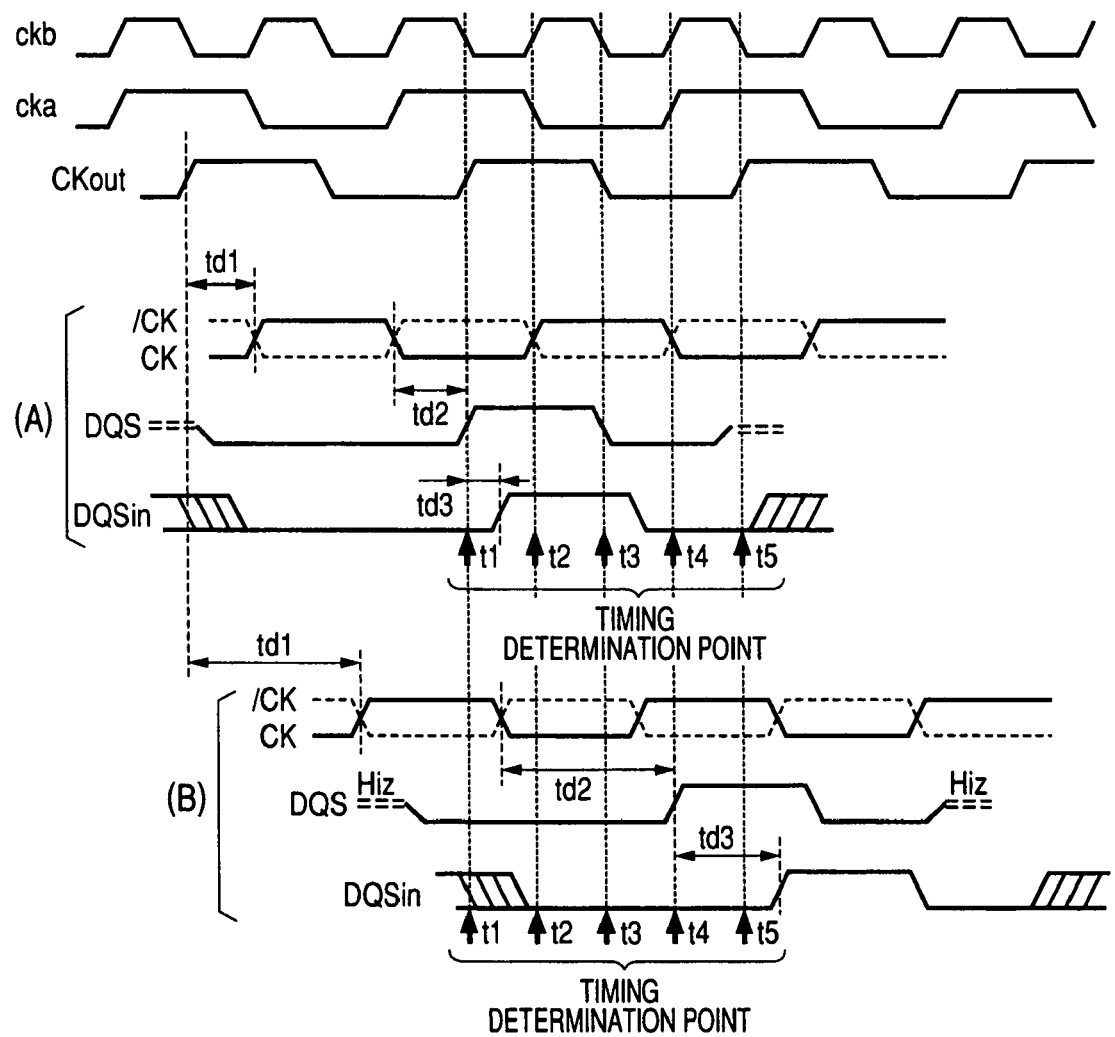
FIG. 18 is a waveform diagram for explaining memory read of FIG. 16.

In the example of FIG. 21(A), it is detected that DQSin has changed from a low to high levels between determination points t2 and t3. On the other hand, it is possible to detect that in FIG. 21(B), the delay times td1 and td3 at MCU are delayed by the worst and DQSin has changed from a low to high levels between determination points t6 and t7. Further, if a worst/worst combination of MCU and MB-DDR SDRAM maximum in the delay times td1 and td3 and td2 is taken, then the determination points are merely delayed by the worst of the delay time td2, for instance, the determination points are merely delayed as in the case of t7 and t8 or t8 and t9. Even though the td1 and td3 are delayed by the worst, DQSin is recognized as a high level (H) even at the determination points t1 and t2 owing to the pull-up operation. It is thus possible to avoid that the undefined level is determined as in the determination point t1 in FIG. 18 referred to above.

In the present embodiment, the pull-up circuit capable of being turned on/off simply and selectively is added for the bidirectional data strobe signal in which a high impedance period exists between the terminal 22 of MCU and its corresponding terminal 13 of MB-DDR SDRAM. Then, its pull-up function is turned on only during the training period such as the time of initialization. Further, the change point from the low level to the high level is found out using a simple clock-synchronous high level/low level determination circuit or the like to which the determination points are fixed, thereby making it possible to determine arriving timing for the data strobe signal.

Even upon connection of a DDR1-SDRAM or DDR2-SDRAM or the like in which a clock frequency is high and the amount of change in the delay value of an input/output element of a controller itself becomes large relatively, even in addition to the memory large in timing variation, such as the above-described mobile DDR SDRAM, a selectively on/off-capable pull-up function is added to a data strobe signal in which a high impedance period unable to properly determine a high level/low level, and the pull-up function is turned on only during a training period such as the time of initialization. It is therefore possible to perfectly avoid misrecognition based on the high impedance period of the data strobe signal.

Thus, the embodiment of FIG. 19 adapts to the large variation in delay time td2 at the time that DLL or the like is not built in the memory. In addition to the above, even when the above-described fluctuation width of delay time td1+td3 on the MCU side becomes relatively large due to the increase in frequency of the clock ckb or the like even though the DLL is built in and the delay time td2 is relatively small and relatively stable, such a problem can be resolved owing to the addition of the simple pull-up circuit and the setting of the training period.

The mobile DDR SDRAM without DLL built therein as mentioned above is capable of reducing relatively large current consumption at the DLL circuit. Thus, it results in one suitable for a battery-driven memory as in the case of a cellular phone device or the like. When a plurality of memory chips are mounted onto one package to constitute a memory having a large storage capacity, the generation of heat due to current consumption becomes a large problem. It is beneficial to mount the plurality of memory chips onto one package to assemble the same into a laminated structure and constitute an image memory or the like by paying attention to the feature that current consumption of the mobile DDR SDRAM having no above DLL is small. In this case, a problem occurs in fast access due to the variation in delay time. However, such a problem can be resolved by using the interface circuit according to the present invention as the interface circuit of the memory controller.

While the invention made above by the present inventors has been described specifically on the basis of the preferred embodiments, the present invention is not limited to the embodiments referred to above. Various changes can be made thereto within the scope not departing from the gist thereof. For example, as specific configurations of the pulse control circuit 40 for generating the test pulse, delay time determination circuits 41 and 43, synchronization circuit 45, sampling circuit 28, and 90° phase shift circuit 27, various embodiments can be adopted. For example, the synchronization circuit 45 may be any one if there is provided such one that the rising point of ckb immediately after DQSin referred to above has changed from the low to high levels is found out from the results of determination by the delay time determination circuits 41 and 43 with the timing of PRout shown in each of FIGS. 2 through 4 as the reference, thereby to take out DQsmp. As to a specific configuration of the 90° phase shift circuit 27, one described in the patent document 1 may be used as it is.

A pull-down circuit may be used as an alternative to the pull-up circuit shown in FIG. 19. At this time, the resistor R1 may be constituted of a polysilicon resistor, a diffused resistor or a MOSFET. The MOSFET Q1 may be one in which its on resistance value is used as the resistor R1 by means of a reduction in its size or the like and which is caused to have both functions of a resistance and a switch.

A memory like a ROM or RAM, a cache memory, an arithmetic unit such as a multiplication/division arithmetic circuit, etc. are provided in the microcontroller MCU as needed in addition to the CPU and external memory controller shown in FIGS. 1 and 5 and the like. The external device may be one if there is adopted one in which data DQ is sent back to MCU in sync with both edges of a clock sent from MCU and DQS formed corresponding to it.

What is claimed is:

1. A semiconductor integrated circuit device comprising:
an interface circuit;
a data processor; and
a clock generator,
wherein the clock generator generates an internal clock and an external clock,
wherein the interface circuit includes:
a first output circuit which supplies the external clock to an external device;
a first input circuit which inputs a data strobe signal formed corresponding to the external clock at the external device;
a second input circuit which inputs data formed in sync with the timing of a change in the data strobe signal at the external device;
a dummy input/output circuit in which signal delay times are respectively equally set to any of the first output circuit and the first and second input circuits;
a pulse control circuit which supplies a test clock to the dummy input/output circuit;
a first delay time determination circuit which determines a signal delay time in response to the test clock sent through the dummy input/output circuit;
a second delay time determination circuit which determines an arriving delay time relative to the internal clock in a predetermined determination region in response to the data strobe signal inputted via the first input circuit;
a sampling circuit which samples the data inputted via the second input circuit in accordance with a timing signal obtained by 90° shifting the phase of the data strobe signal inputted through the first input circuit; and
a synchronization circuit which synchronizes the sampled data with the internal clock on the basis of the result of determination by the second delay time determination circuit, and
wherein the determination region of the second delay time determination circuit is changed in time based on the result of determination by the first delay time determination circuit.

2. The semiconductor integrated circuit device according to claim 1,
wherein the interface circuit further includes a second output circuit whose output terminal is connected to an input terminal of the first input circuit, and a third output circuit whose output terminal is connected to an input terminal of the second input circuit, wherein the second output circuit supplies a data strobe signal to the external device, and wherein the third output circuit supplies data to the external device in sync with the timing of a change in the data strobe signal outputted through the second output circuit.

3. The semiconductor integrated circuit device according to claim 2, wherein an output terminal of an output circuit constituting the dummy input/output circuit and an input terminal of an input circuit thereof are connected to external terminals.

4. The semiconductor integrated circuit device according to claim 2, further comprising a correction circuit which receives an output signal of the first delay time determination circuit, wherein the determination output of the first delay time determination circuit is matched with the signal delay time corresponding to any of the first output circuit and the first and second input circuits by the correction circuit.

5. The semiconductor integrated circuit device according to claim 3, wherein the external device is a mobile DDR SDRAM having no clock synchronization circuit.

6. The semiconductor integrated circuit device according to claim 5, further comprising a memory controller which is provided corresponding to the interface circuit and performs access control on the mobile DDR SDRAM.

7. The semiconductor integrated circuit device according to claim 6, wherein the memory controller generates a dummy read cycle for performing the operation of determination by the second delay time determination circuit when a read cycle is absent during a predetermined refresh interval of the mobile DDR SDRAM.

8. The semiconductor integrated circuit device according to claim 7, wherein the memory controller generates a dummy read cycle for performing the operation of determination by the second delay time determination circuit in response to a power-on reset.

9. The semiconductor integrated circuit device according to claim 8, wherein the operation of determination by the first delay time determination circuit is performed in a refresh cycle of the mobile DDR SDRAM.

10. The semiconductor integrated circuit device according to claim 9, wherein the determination operation of the first delay time determination circuit is performed every plural refresh cycles.

11. A semiconductor integrated circuit device comprising:
an interface circuit;
a data processor; and
a clock generator,
wherein the clock generator generates an internal clock and an external clock,
wherein the interface circuit includes:
a first output circuit which supplies the external clock to an external device;
a first input circuit which inputs a data strobe signal formed corresponding to the external clock at the external device;
a second input circuit which inputs data formed in sync with the timing of a change in the data strobe signal at the external device;
a third input/output circuit connected to a first capacitance unit;
a pulse control circuit capable of outputting a pulse signal to the third input/output circuit;
a first delay time determination circuit which determines a signal delay time in response to the pulse signal sent through the third input/output circuit;
a second delay time determination circuit which determines an arriving delay time relative to the internal clock in a predetermined determination region in response to the data strobe signal inputted via the first input circuit;
a sampling circuit which samples the data inputted via the second input circuit in accordance with a timing signal obtained by 90° shifting the phase of the data strobe signal inputted through the first input circuit; and
a synchronization circuit which synchronizes the sampled data with the internal clock on the basis of the result of determination by the second delay time determination circuit, and
wherein the determination region of the second delay time determination circuit is changed in time based on the result of determination by the first delay time determination circuit.

12. The semiconductor integrated circuit device according to claim 11,
wherein the interface circuit further includes a second output circuit whose output terminal is connected to an input terminal of the first input circuit, and a third output circuit whose output terminal is connected to an input terminal of the second input circuit,
wherein the second output circuit supplies a data strobe signal to the external device, and
wherein the third output circuit supplies data to the external device in sync with the timing of a change in the data strobe signal outputted through the second output circuit.

13. The semiconductor integrated circuit device according to claim 12,
wherein the third input/output circuit has an output circuit and an input circuit, and
wherein an output terminal of the output circuit is connected in parallel with the first capacitance unit and an input terminal of the input circuit.

14. The semiconductor integrated circuit device according to claim 13, wherein the first capacitance unit is a PAD terminal connected with the output terminal of the output circuit and formed over a semiconductor substrate.

15. The semiconductor integrated circuit device according to claim 12, further comprising a correction circuit which receives an output signal of the first delay time determination circuit,
wherein the determination output of the first delay time determination circuit is matched with the signal delay time corresponding to any of the first output circuit and the first and second input circuits by the correction circuit.

16. The semiconductor integrated circuit device according to claim 13, wherein the external device is a mobile DDR SDRAM having no clock synchronization circuit.

17. The semiconductor integrated circuit device according to claim 16, further comprising a memory controller which is provided corresponding to the interface circuit and performs access control on the mobile DDR SDRAM.

18. The semiconductor integrated circuit device according to claim 17, wherein the memory controller generates a dummy read cycle for performing the operation of determination by the second delay time determination circuit when a read cycle is absent during a predetermined refresh interval of the mobile DDR SDRAM.

19. The semiconductor integrated circuit device according to claim 18, wherein the memory controller generates a dummy read cycle for performing the operation of determination by the second delay time determination circuit in response to a power-on reset.

20. The semiconductor integrated circuit device according to claim 19, wherein the operation of determination by the first delay time determination circuit is performed in a refresh cycle of the mobile DDR SDRAM.

21. The semiconductor integrated circuit device according to claim 20, wherein the determination operation of the first delay time determination circuit is performed every plural refresh cycles.

22. A semiconductor integrated circuit device comprising:
an interface circuit;
a data processor; and
a clock generator,
wherein the clock generator generates an internal clock and an external clock,
wherein the interface circuit includes:
 a first output circuit which supplies the external clock to an external device through a first external terminal;
 a second output circuit which supplies a control signal formed by the data processor to the external device through a second external terminal;
 a third output circuit which supplies a first data strobe signal corresponding to the external clock to the external device through a third external terminal;
 a fourth output circuit which supplies data synchronized with the timing of a change in the first data strobe signal to the external device through a fourth external terminal;
 a first input circuit which inputs a second data strobe signal corresponding to the external clock at the external device through the third external terminal;
 a second input circuit which inputs data synchronized with the timing of a change in the second data strobe signal at the external device through the fourth external terminal;
 a delay time determination circuit which determines an arriving delay time relative to the internal clock in response to the second data strobe signal inputted through the first input circuit;
 a sampling circuit which samples data inputted through the second input circuit in accordance with a timing signal obtained by 90° shifting the phase of the second data strobe signal inputted through the first input circuit; and
 a synchronization circuit which synchronizes the sampled data with the internal clock, based on the result of determination by the delay time determination circuit,
wherein each of the third output circuit and the fourth output circuit comprises a tri-state output circuit which performs an output operation when an output control signal is one level and which is brought to an output high impedance state when the output control signal is the other level, and
wherein the third output circuit is provided with a circuit which when the circuit is in an output high impedance state by the output control signal, sets the third output external terminal to a fixed level corresponding to a high or low level in accordance with a predetermined signal, and the operation of determination by the delay time determination circuit is performed during this period.

23. The semiconductor integrated circuit device according to claim 22, wherein the external device is a DDR SDRAM having no clock synchronization circuit.

24. The semiconductor integrated circuit device according to claim 23, further comprising a memory controller which is provided corresponding to the interface circuit and performs access control on the DDR SDRAM having no clock synchronization circuit.

25. The semiconductor integrated circuit device according to claim 24, wherein the memory controller executes a dummy read cycle for generating the predetermined signal in response to a power-on reset and performing the operation of determination by the delay time determination circuit.

26. The semiconductor integrated circuit device according to claim 25, wherein the memory controller generates the predetermined signal when a refresh cycle of the DDR SDRAM unprovided with the clock synchronization circuit is instructed, thereby to execute the operation of determination by the delay time determination circuit.

27. The semiconductor integrated circuit device according to claim 26, wherein the operation of determination by the delay time determination circuit is performed every plural refresh cycles.

* * * * *